(12) United States Patent
Weng et al.

(10) Patent No.: US 11,590,688 B2
(45) Date of Patent: Feb. 28, 2023

(54) IMPRINTING APPARATUS

(71) Applicant: HIMAX TECHNOLOGIES LIMITED, Tainan (TW)

(72) Inventors: Ruei Yu Weng, Tainan (TW); Han-Yi Kuo, Tainan (TW); Yin-Tung Lu, Tainan (TW); Jui Pin Tsai, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 17/460,296

(22) Filed: Aug. 29, 2021

(65) Prior Publication Data

US 2022/0001594 A1 Jan. 6, 2022

Related U.S. Application Data

(63) Continuation-in-part of application No. 17/325,211, filed on May 20, 2021, now Pat. No. 11,531,267.

(30) Foreign Application Priority Data

Jul. 2, 2020 (TW) .................................. 109122406
May 6, 2021 (TW) .................................. 110116314

(51) Int. Cl.
*G03F 7/00* (2006.01)
*B29C 59/04* (2006.01)
(Continued)

(52) U.S. Cl.
CPC ............ *B29C 59/04* (2013.01); *B29C 59/002* (2013.01); *B29C 59/022* (2013.01); *B82Y 40/00* (2013.01);
(Continued)

(58) Field of Classification Search
CPC ..... G03F 7/0002; B29C 59/04; B29C 59/046; B41F 16/002
See application file for complete search history.

(56) References Cited

U.S. PATENT DOCUMENTS

| 10,946,577 B2 | 3/2021 | Yu et al. |
| 2009/0174118 A1 | 7/2009 | Maeda et al. |

(Continued)

FOREIGN PATENT DOCUMENTS

| CN | 103025532 | 4/2013 |
| CN | 103228452 | 7/2013 |

(Continued)

OTHER PUBLICATIONS

"Office Action of Taiwan Counterpart Application", dated Nov. 25, 2021, p. 1-p. 10.

(Continued)

*Primary Examiner* — Larry W Thrower
*Assistant Examiner* — John W Hatch
(74) *Attorney, Agent, or Firm* — JCIPRNET

(57) ABSTRACT

An imprinting apparatus includes an imprinting platform, an imprinting roller, a transfer module and a lifting and pressing mechanism. The imprinting roller is disposed above the imprinting platform. The transfer module includes a transfer film, wherein the transfer film is located between the imprinting roller and the imprinting platform. The lifting and pressing mechanism is linked with the imprinting roller, wherein the lifting and pressing mechanism drives the imprinting roller to move along a normal direction of the imprinting platform and selectively pressurizes the imprinting roller.

13 Claims, 27 Drawing Sheets

(51) Int. Cl.
  *B82Y 40/00* (2011.01)
  *B29C 59/00* (2006.01)
  *B29C 59/02* (2006.01)
  *B29L 31/00* (2006.01)

(52) U.S. Cl.
  CPC . *B29C 2059/023* (2013.01); *B29L 2031/7562* (2013.01)

(56) References Cited

U.S. PATENT DOCUMENTS

| | | | |
|---|---|---|---|
| 2014/0252679 A1 | 9/2014 | Hwang et al. | |
| 2015/0217505 A1* | 8/2015 | Fischer | G03F 7/0017 264/293 |
| 2017/0074304 A1 | 3/2017 | Bowers et al. | |
| 2019/0361340 A1* | 11/2019 | Yu | G03F 7/0002 |

FOREIGN PATENT DOCUMENTS

| | | | |
|---|---|---|---|
| CN | 104002545 | 8/2014 | |
| CN | 106773531 | 5/2017 | |
| CN | 107000308 | 8/2017 | |
| CN | 111208708 | 5/2020 | |
| EP | 3754426 | 12/2020 | |
| JP | 2007019451 | 1/2007 | |
| JP | 2014054735 | 3/2014 | |
| JP | 2019531921 | 11/2019 | |
| KR | 101649823 B1 * | 8/2016 | |
| KR | 101062128 B1 * | 9/2019 | |
| TW | 201634295 | 10/2016 | |
| TW | 201811538 | 4/2018 | |
| WO | WO-2013126750 A1 * | 8/2013 | ............. B29C 59/02 |

OTHER PUBLICATIONS

"Search Report of Europe Counterpart Application", dated Dec. 15, 2021, p. 1-p. 5.
"Office Action of Japanese Counterpart Application", dated May 9, 2022, p. 1-p. 4.
"Office Action of China Counterpart Application", dated Dec. 14, 2022, p. 1-p. 8.
"Search Report of Europe Counterpart Application", dated Nov. 24, 2022, p. 1-p. 10.

* cited by examiner

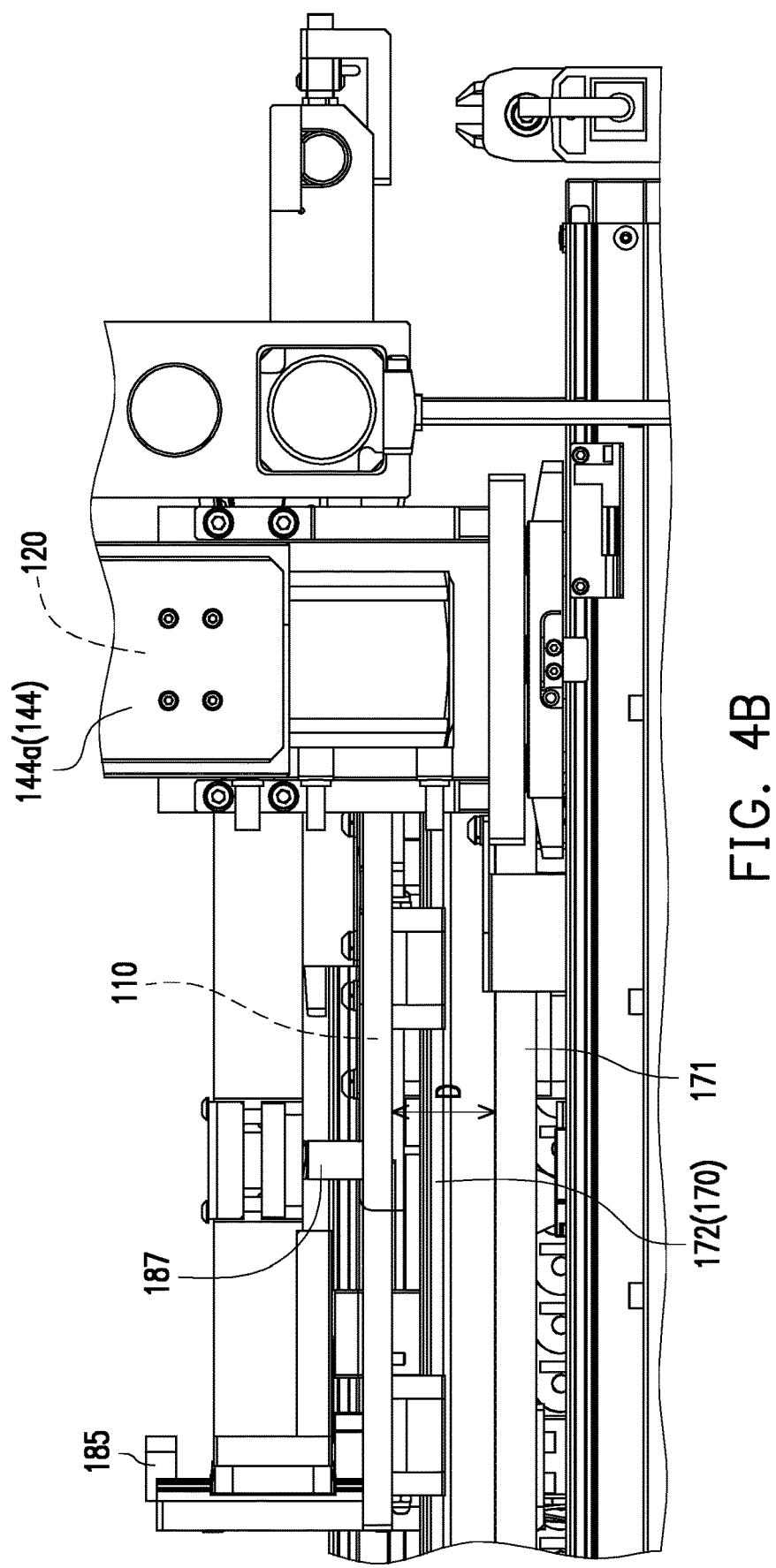

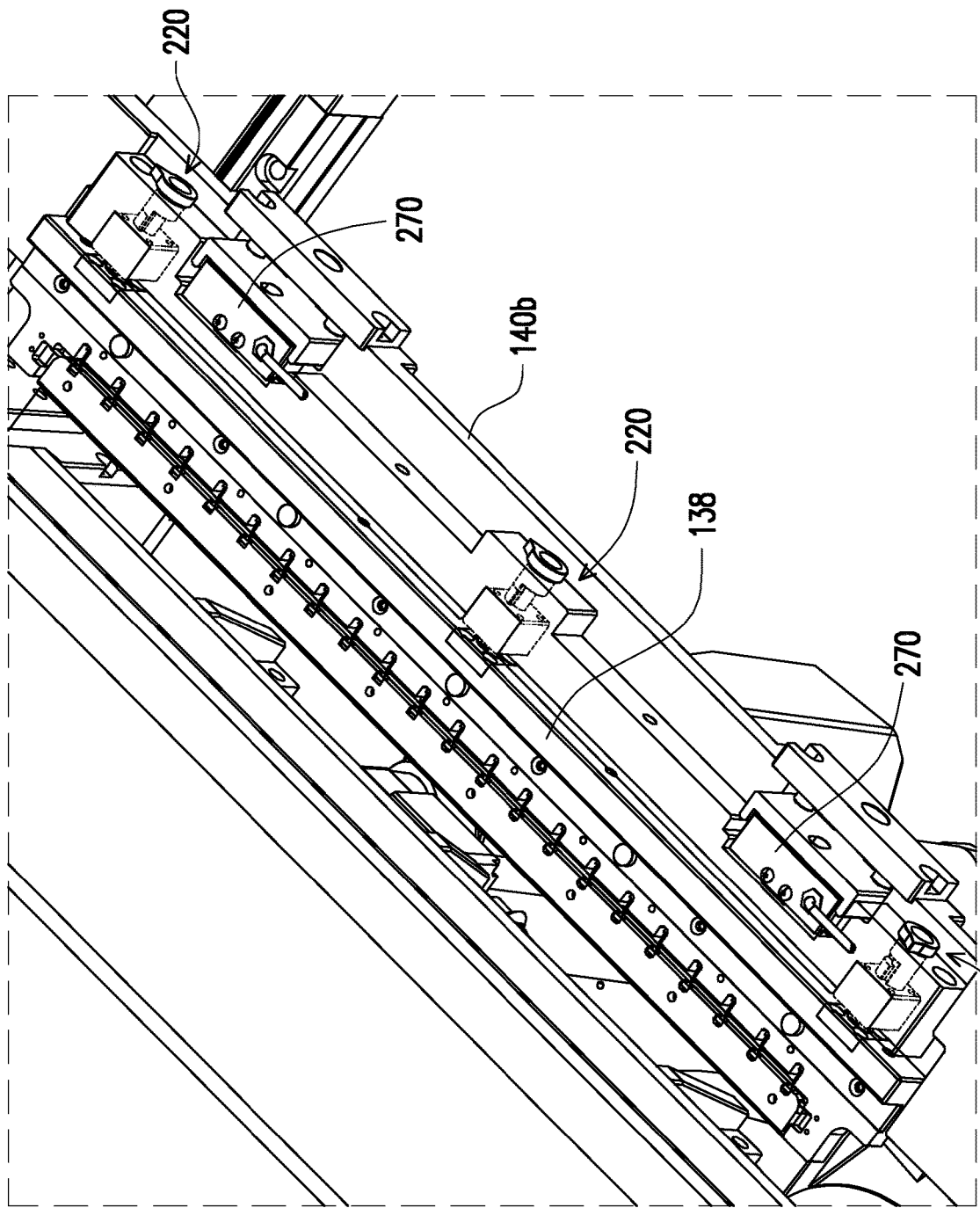

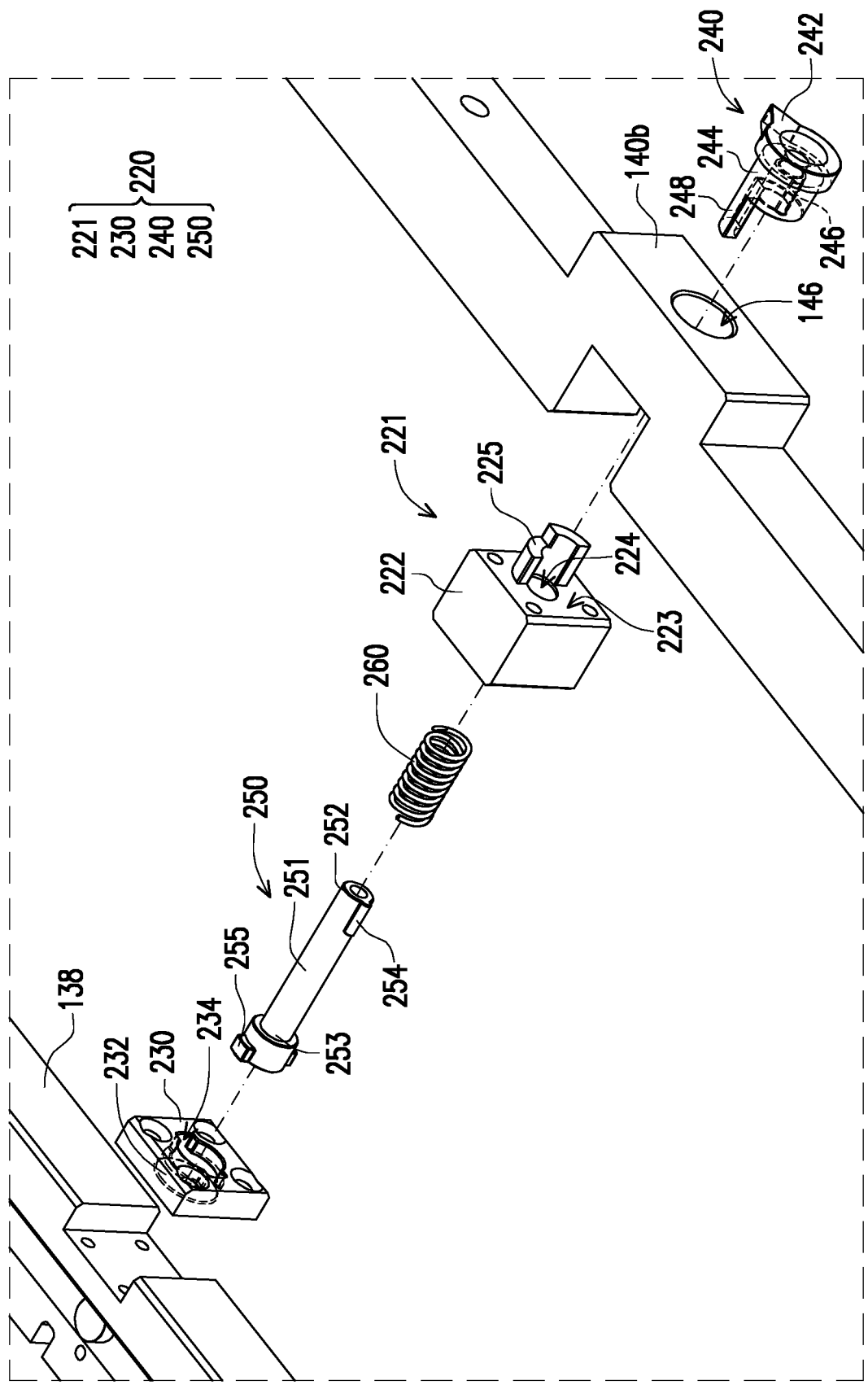

IMPRINTING APPARATUS

CROSS-REFERENCE TO RELATED APPLICATION

This application is a continuation-in-part application of and claims the priority benefit of U.S. application Ser. No. 17/325,211, filed on May 20, 2021, now pending, which claims the priority benefit of Taiwanese application no. 109122406, filed on Jul. 2, 2020, and Taiwanese application no. 110116314, filed on May 6, 2021. The entirety of each of the above-mentioned patent applications is hereby incorporated by reference herein and made a part of this specification.

BACKGROUND

Technical Field

The disclosure relates to an imprinting apparatus; particularly, the disclosure relates to an imprinting apparatus with a relatively high yield of products.

Description of Related Art

Currently, after imprinting is completed on a nanoimprinting machine, separation between a transfer film and a product is mostly by lifting the transfer film located above the imprinting platform and pulling it slowly to separate from the product. However, the above-mentioned is not adaptive to resist and parameter changes of the product, and thus the imprinted product structure may be damaged due to the film separation process, thereby reducing the imprinting yield of products.

SUMMARY

The disclosure is directed to an imprinting apparatus, which increases an imprinting yield and operating convenience.

According to an embodiment of the disclosure, the imprinting apparatus includes an imprinting platform, an imprinting roller, a transfer module and a lifting and pressing mechanism. The imprinting roller is disposed above the imprinting platform. The transfer module includes a transfer film, wherein the transfer film is located between the imprinting roller and the imprinting platform. The lifting and pressing mechanism is linked with the imprinting roller, wherein the lifting and pressing mechanism drives the imprinting roller to move along a normal direction of the imprinting platform and selectively pressurizes the imprinting roller. When the imprinting roller is moved by the lifting and pressing mechanism to a first position, the lifting and pressing mechanism does not pressurize the imprinting roller, the imprinting roller contacts the transfer film located on the imprinting platform, and the transfer film is pressed by a weight of the imprinting roller. When the imprinting roller is moved by the lifting and pressing mechanism to a second position, the lifting and pressing mechanism pressurizes the imprinting roller, the imprinting roller contacts the transfer film, and the transfer film is pressed by a combination of the weight of the imprinting roller and a pressure of the lifting and pressing mechanism.

According to an embodiment of the disclosure, the lifting and pressing mechanism includes a driving source, a base connected to the driving source, a holder disposed at an end of the imprinting roller and located in the base, the base includes a lower part, an upper part and a guide post located between and connected to the lower part and the upper part, the guide post extends along the normal direction, the holder is slidably disposed at the guide post.

According to an embodiment of the disclosure, the lifting and pressing mechanism further includes a pressure sensor fixed to the upper part of the base and located between the upper part of the base and the holder, when the imprinting roller is at the first position, the holder contacts the lower part of the base, and a gap is formed between the holder and the pressure sensor, when the imprinting roller is at the second position, the holder contacts and presses the pressure sensor.

According to an embodiment of the disclosure, the lifting and pressing mechanism includes two levelness detectors located at two ends of the imprinting roller.

According to an embodiment of the disclosure, the imprinting apparatus further includes a film separation module and a fixing module, wherein the transfer module includes a frame, the transfer film is disposed at the frame, the frame is detachably disposed at the film separation module by the fixing module.

According to an embodiment of the disclosure, the fixing module includes a first fixing member fixed at the film separation module, a second fixing member fixed at the frame, a first rotating member passing through a first hole of the film separation module and located at a side of the first fixing member, and a second rotating member passing through the first fixing member and located between the first rotating member and the second fixing member.

According to an embodiment of the disclosure, the first rotating member includes a knob exposed from the film separation module, a first main body having a slot, and a first blocking member extending from the first main body to a direction away from the knob, the first main body passes through the first hole of the film separation module.

According to an embodiment of the disclosure, the first fixing member includes a second main body, a second hole formed on the second main body and corresponding to the first hole and a second blocking member protruding from a surface of the second main body towards the first rotating member. When the first rotating member is located at an original position, the first blocking member of the first rotating member is aligned with the second blocking member of the first fixing member, such that a movement of the first rotating member towards the first fixing member is limited by the second blocking member, when the first rotating member is rotated to a position that the first blocking member is staggered with the second blocking member, the first rotating member is adapted to move towards the surface of the second main body.

According to an embodiment of the disclosure, the second rotating member includes a third main body passing through the second hole of the first blocking member and having a first side close to the first rotating member and a second side close to the second fixing member, a protrusion located on an outer surface of the third main body, near the first side and inserted into the slot of the first rotating member, and a locking part located at the second side.

According to an embodiment of the disclosure, the second fixing member includes an inner space and a positioning hole communicated with the inner space. When the first rotating member moves towards the surface of the second main body, the second rotating member is pushed by the first rotating member such that the locking part of the second rotating member passes through the positioning hole and enters to the inner space of the second fixing member, and then the locking part of the second rotating member is rotated to a position staggered with the positioning hole by rotating the knob such that the frame is locked to film separation module.

According to an embodiment of the disclosure, the fixing module further includes an elastic member sleeved on the second main body and disposed between the locking part and the first main body.

According to an embodiment of the disclosure, the imprinting apparatus further includes adjustable load cells disposed at a side of the transfer film.

According to an embodiment of the disclosure, the imprinting apparatus also includes a tensile force adjustment mechanism. The tensile force adjustment mechanism includes two rods and two lifting machines. An extension direction of the two rods is parallel to an extension direction of the imprinting roller. The two rods are in contact against the transfer film and are respectively located between the fixed frame of the transfer module and the imprinting platform and between the movable frame of the transfer module and the imprinting platform. The two lifting machines respectively adjust lifted heights of the two rods, and the transfer film is pulled open through lifting by the two rods to generate a tensile force.

According to an embodiment of the disclosure, a length of each of the rods is greater than a width of the transfer film.

According to an embodiment of the disclosure, the tensile force adjustment mechanism also includes two tensile force sensors. The two tensile force sensors are respectively disposed between the two rods and the two lifting machines to detect a real-time tensile force of the transfer film.

Based on the foregoing, in the imprinting apparatus of the disclosure, the lifting and pressing mechanism drives the imprinting roller to move along the normal direction of the imprinting platform and selectively pressurize the imprinting roller. When the imprinting roller is moved by the lifting and pressing mechanism to the first position, the lifting and pressing mechanism does not pressurize the imprinting roller, the imprinting roller contacts the transfer film located on the imprinting platform, and the transfer film is pressed by a weight of the imprinting roller. When the imprinting roller is moved by the lifting and pressing mechanism to the second position, the lifting and pressing mechanism pressurizes the imprinting roller, the imprinting roller contacts the transfer film, and the transfer film is pressed by a combination of the weight of the imprinting roller and a pressure of the lifting and pressing mechanism. Therefore, the imprinting roller of the imprinting apparatus can use more versatile and flexible pressure to imprint the transfer film and the imprinting platform through the lifting and pressing mechanism.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4B is a side view of FIG. 4A.

FIG. 9B is a partial enlarged view of the fixing module of FIG. 9A.

FIG. 9C is an exploded view of the fixing module of FIG. 9B.

DESCRIPTION OF THE EMBODIMENTS

Figure 1:
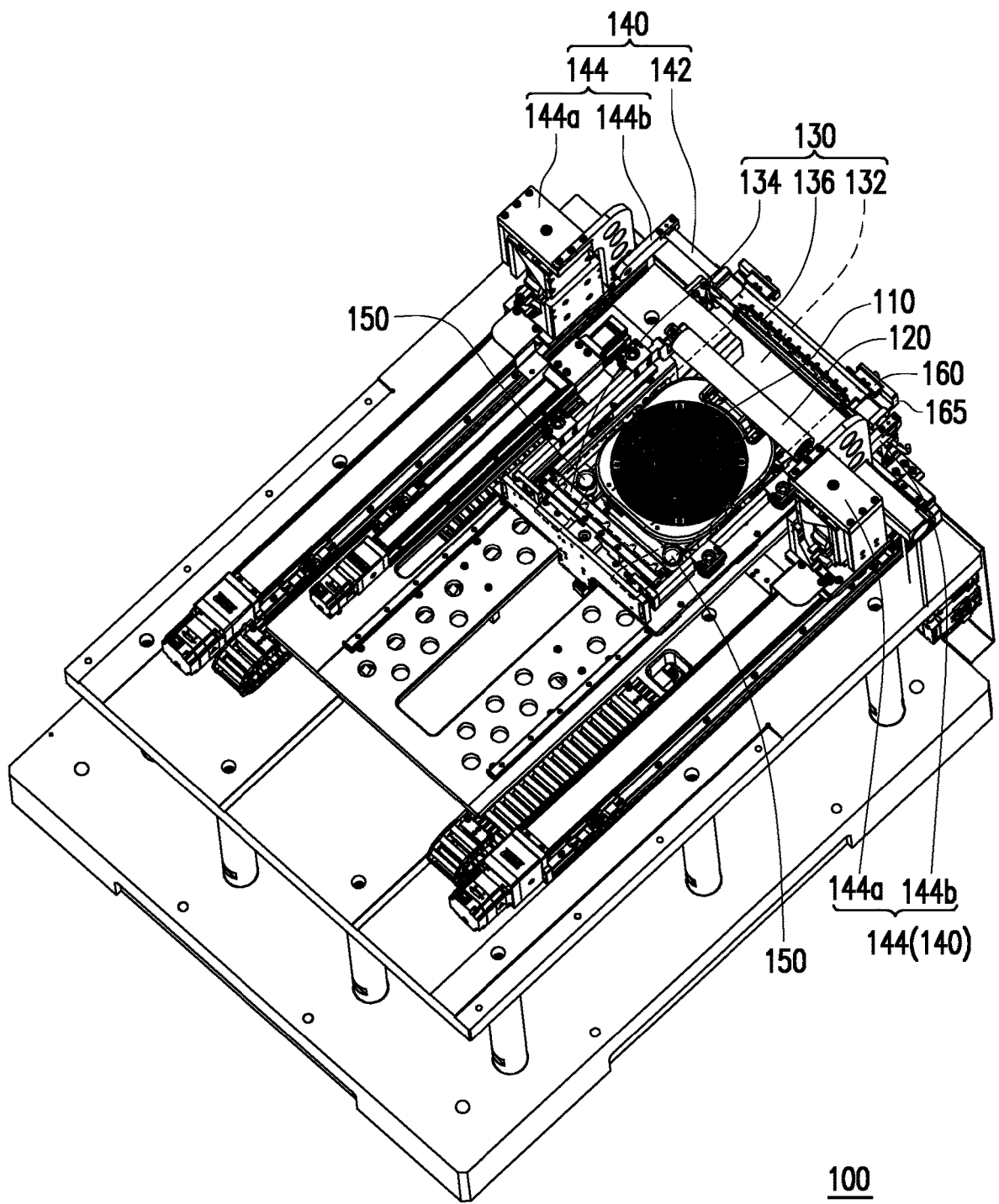
FIG. 1 is a perspective view of an imprinting apparatus according to an embodiment of the disclosure.

Reference will now be made in detail to the exemplary embodiments of the disclosure, examples of which are illustrated in the accompanying drawings. Wherever possible, the same element symbols are used in the drawings and description to denote the same or similar parts.

Figure 2A:
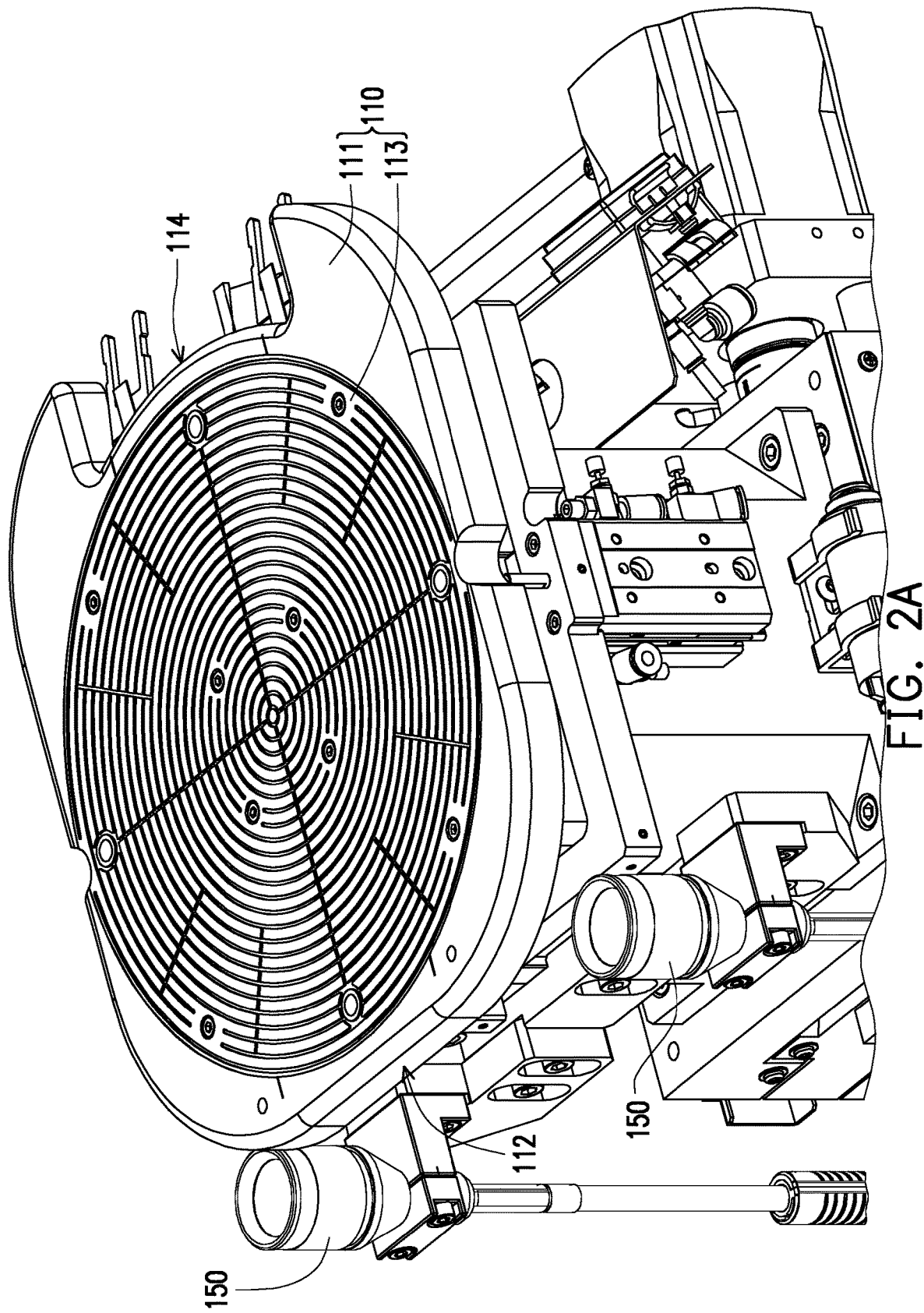
FIG. 2A is a perspective view of an imprinting platform and a white light interferometer in the imprinting apparatus of FIG. 1.
Figure 2B:
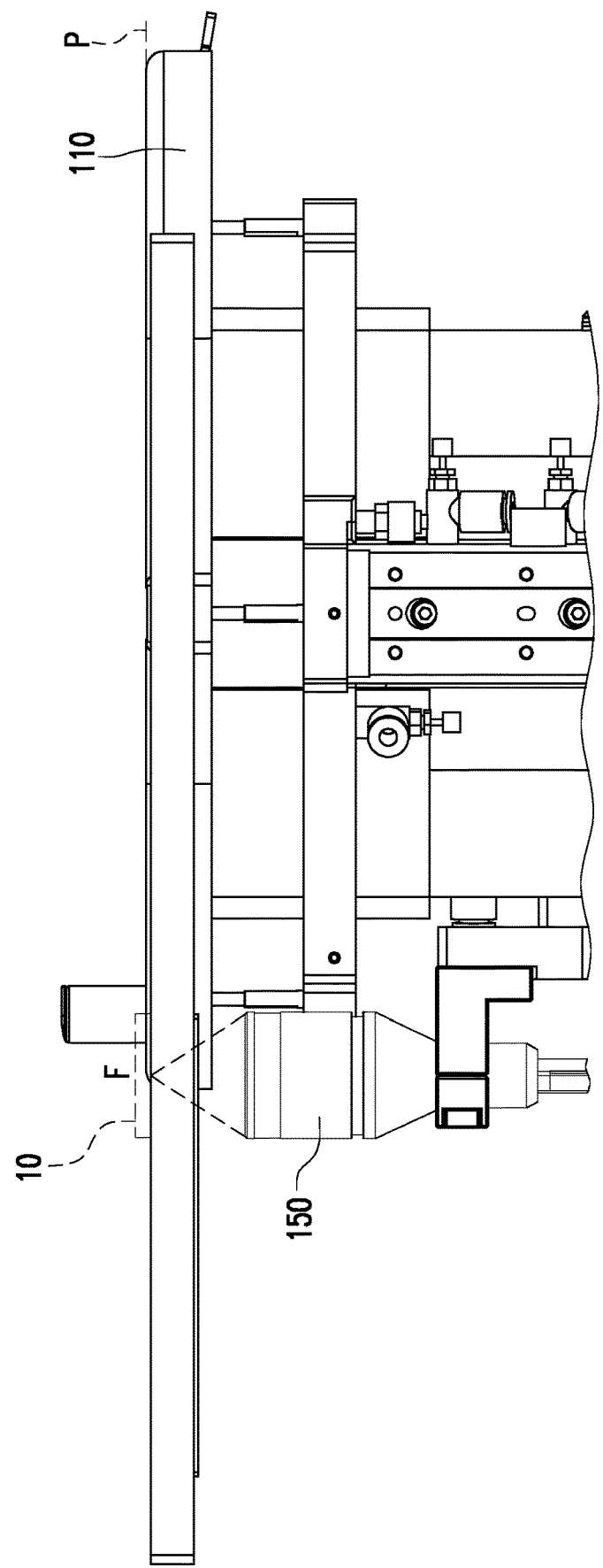
FIG. 2B is a side view of FIG. 2A.
Figure 3:
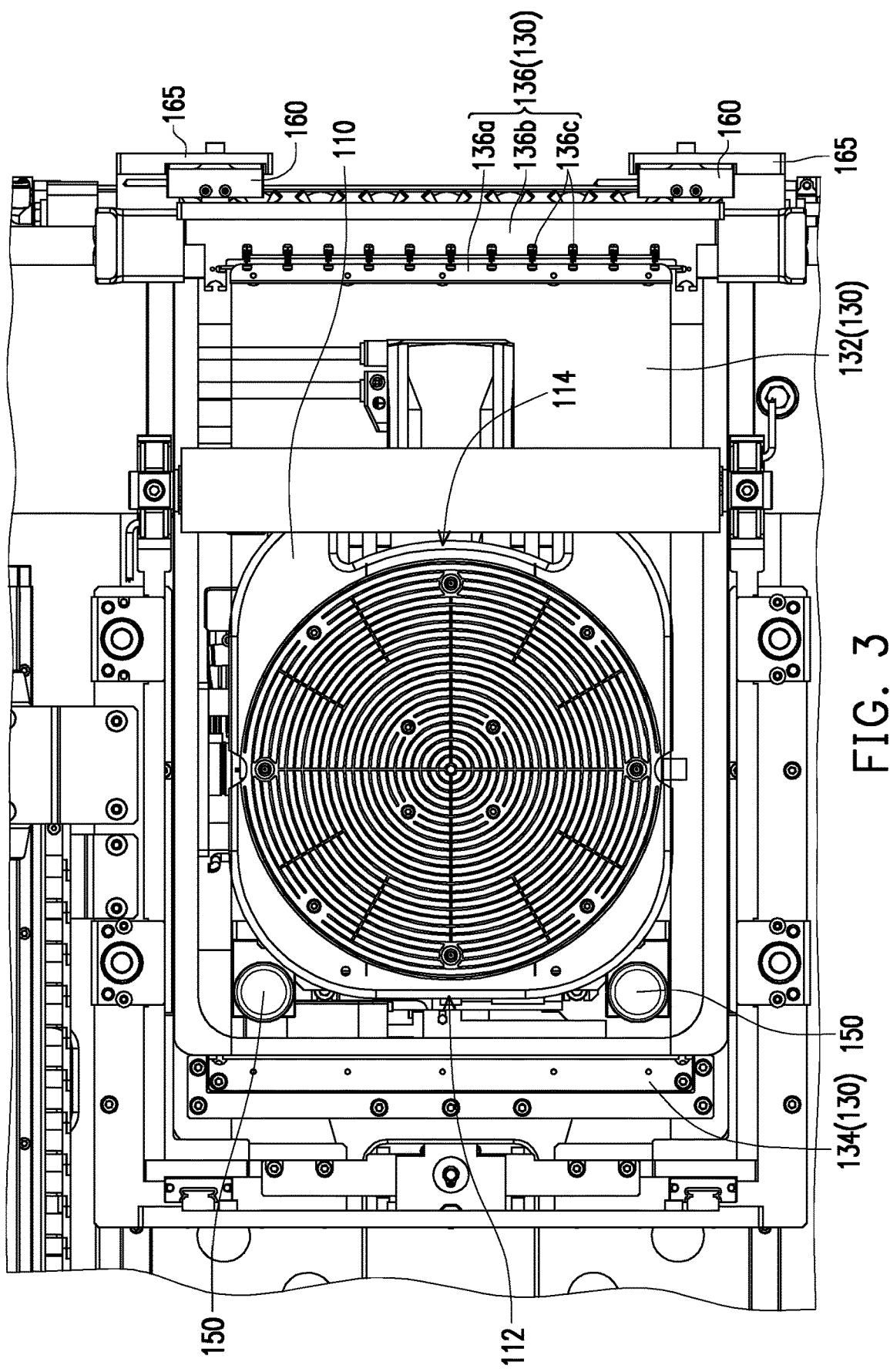
FIG. 3 is a partial top view of the imprinting apparatus of FIG. 1.
Figure 4A:
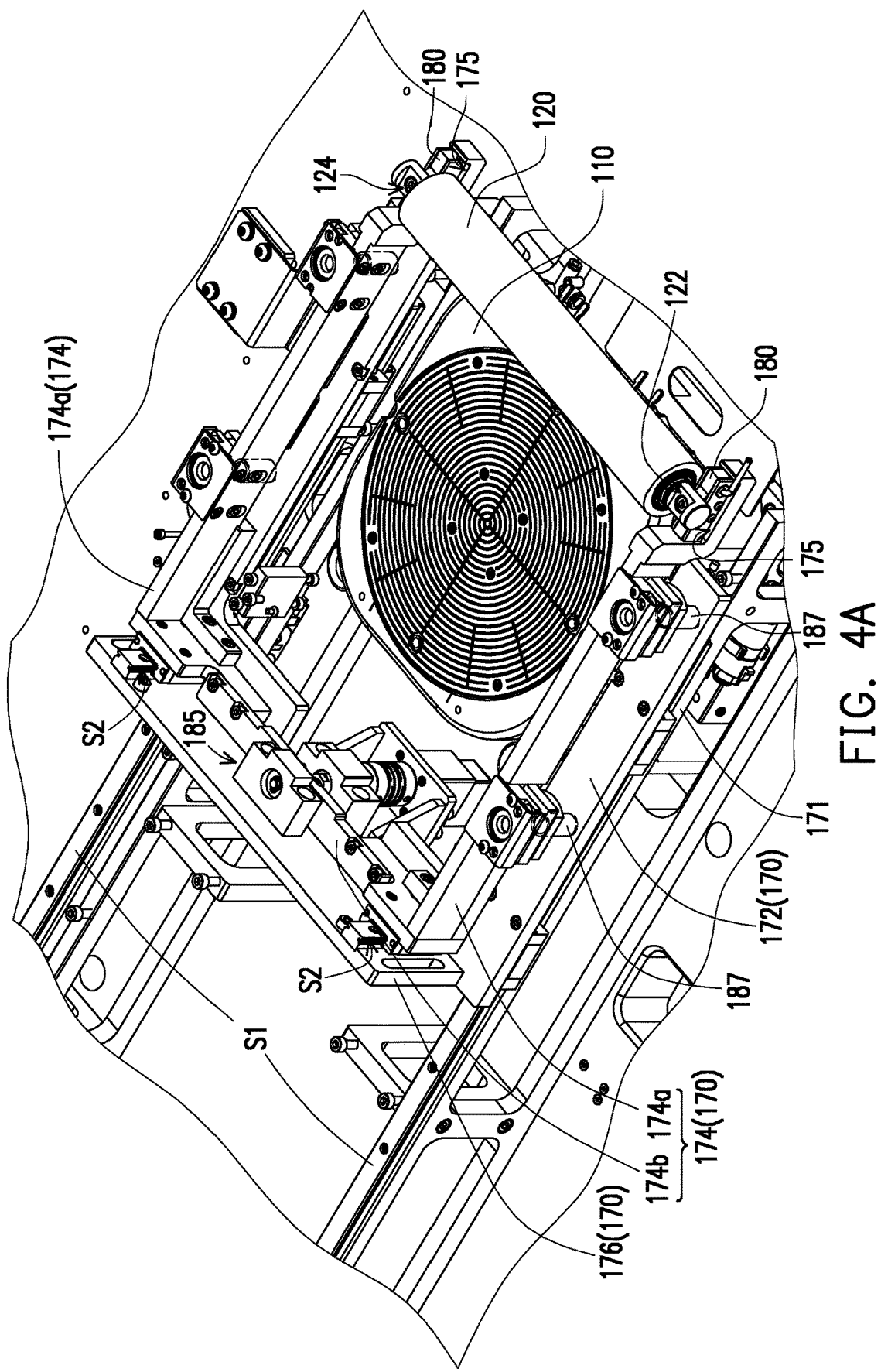
FIG. 4A is a partially enlarged perspective view of the imprinting apparatus of FIG. 1 from another view angle.
Figure 5A:
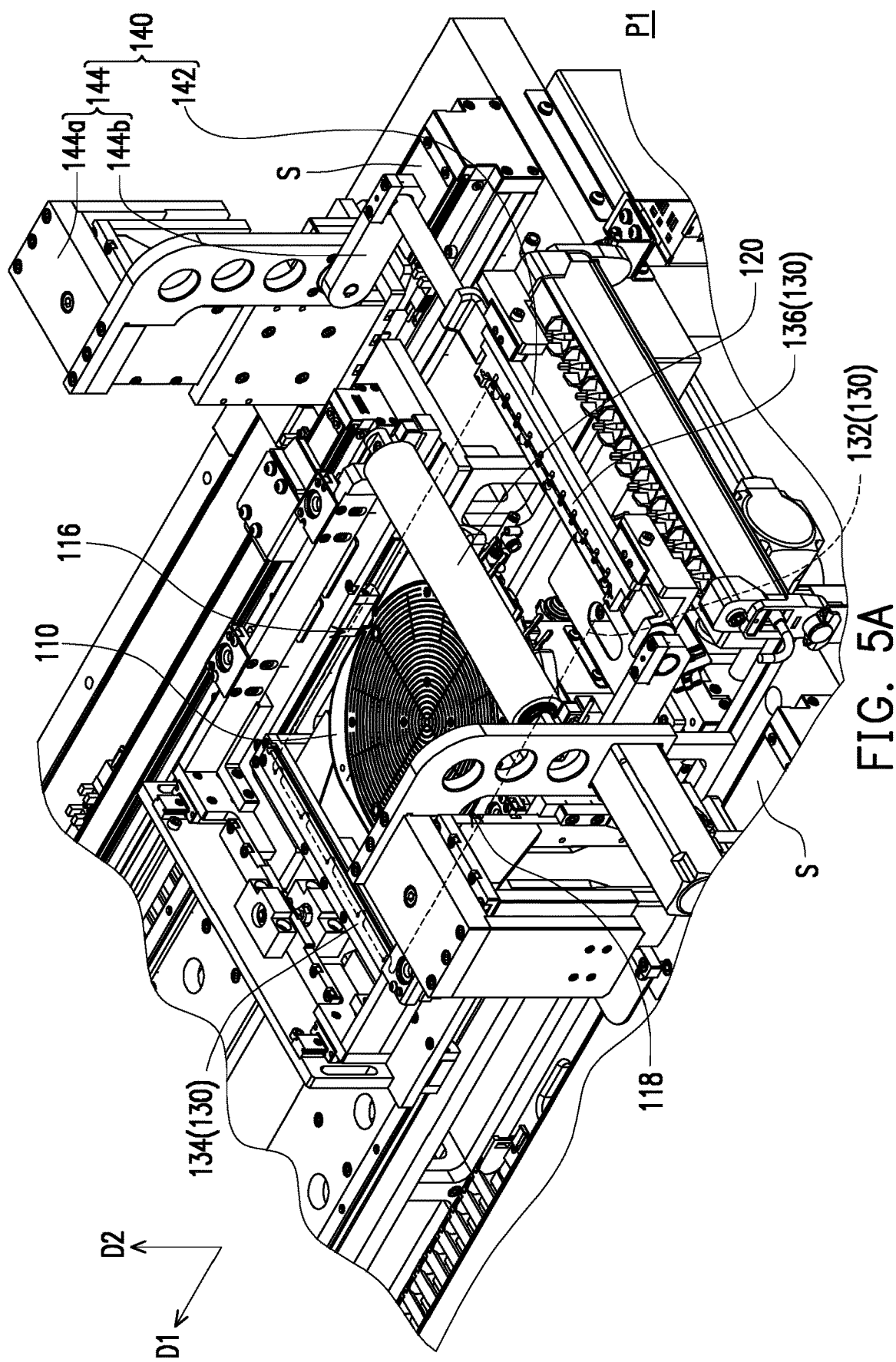
FIG. 5A is a partially enlarged perspective view of the imprinting apparatus of FIG. 1 from yet another view angle.
Figure 5B:
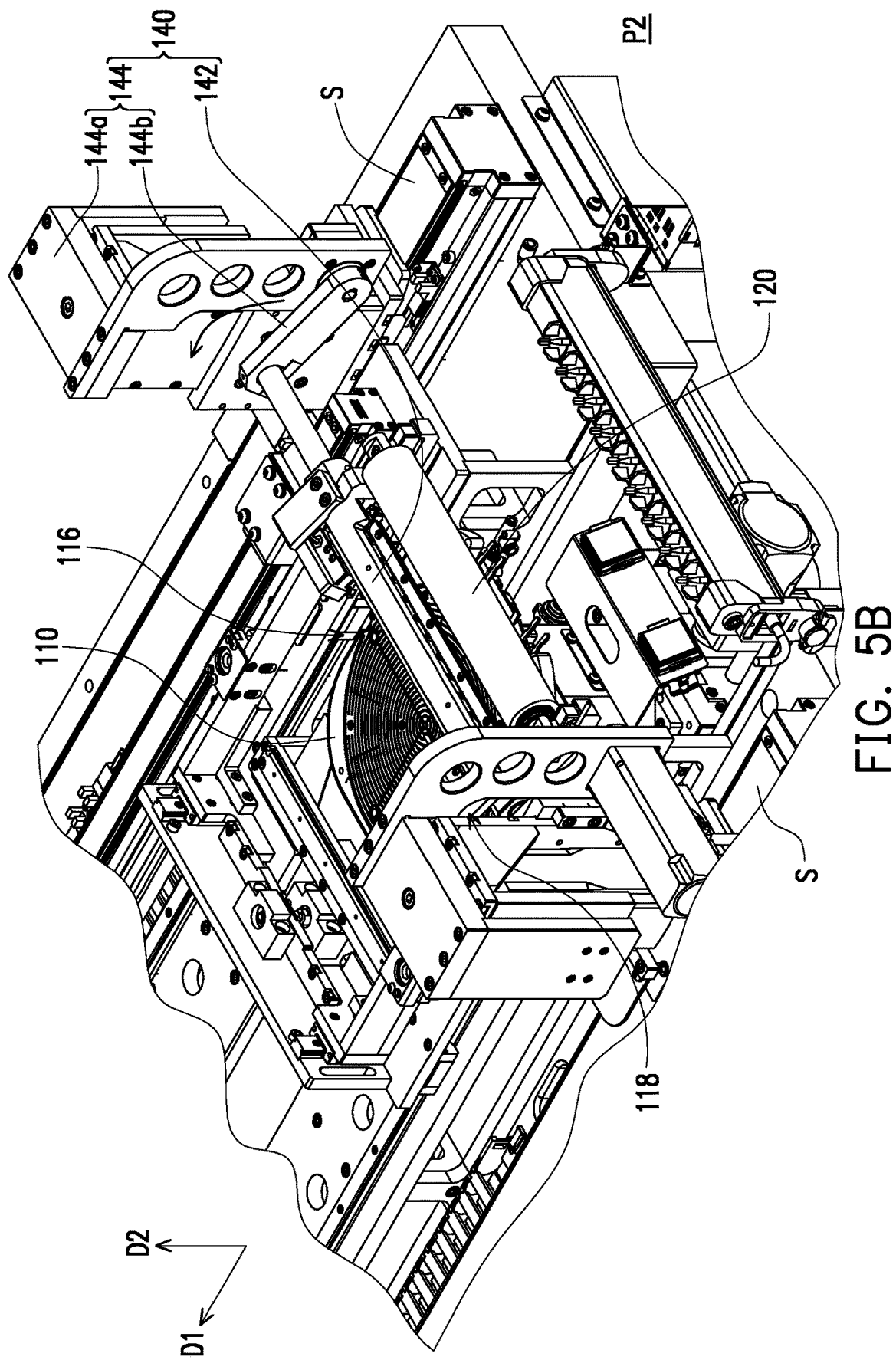
FIG. 5B is a partially enlarged perspective view showing a movable frame of a transfer module in the imprinting apparatus of FIG. 1 located in a second position.
Figure 5C:
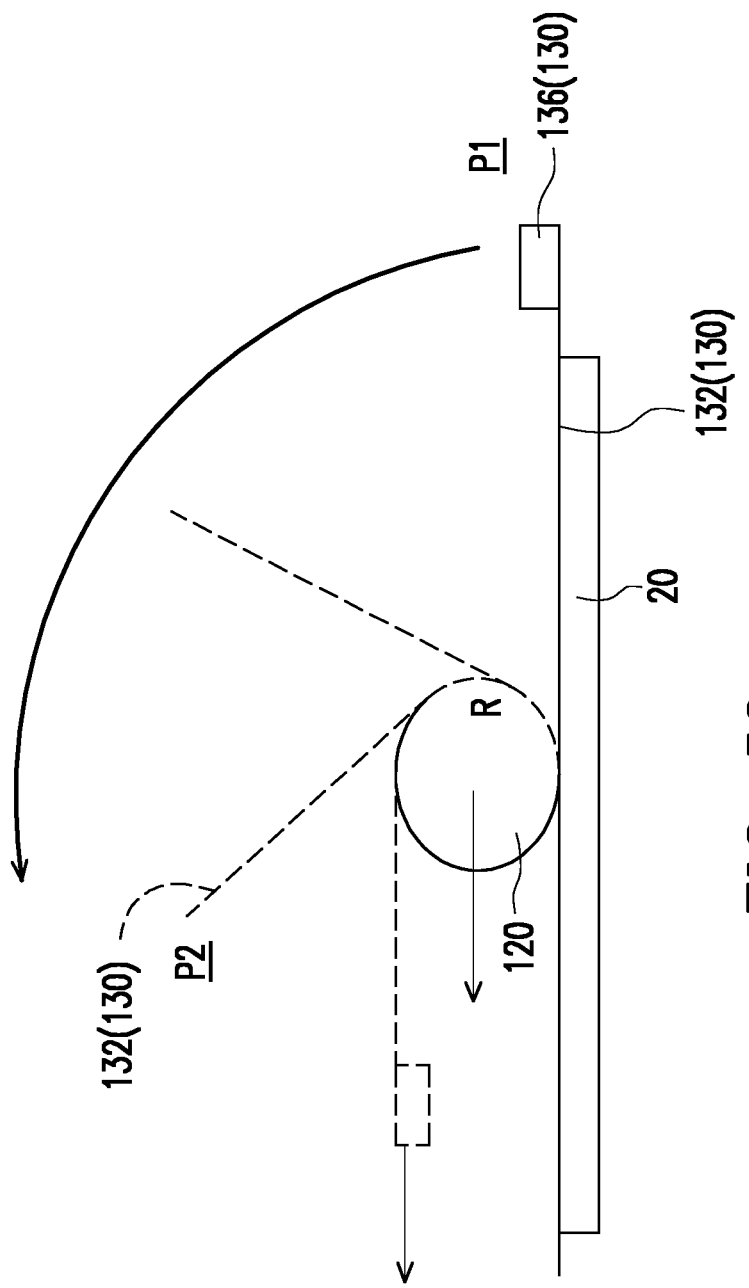
FIG. 5C is a schematic view of operation between a transfer film and an imprinting roller when a film separation module drives the movable frame to be turned.

FIG. 1 is a perspective view of an imprinting apparatus according to an embodiment of the disclosure. FIG. 2A is a perspective view of an imprinting platform and a white light interferometer in the imprinting apparatus of FIG. 1. FIG. 2B is a side view of FIG. 2A. FIG. 3 is a partial top view of the imprinting apparatus of FIG. 1. FIG. 4A is a partially enlarged perspective view of the imprinting apparatus of FIG. 1 from another view angle. FIG. 4B is a side view of FIG. 4A. FIG. 5A is a partially enlarged perspective view of the imprinting apparatus of FIG. 1 from yet another view angle. FIG. 5B is a partially enlarged perspective view showing a movable frame of a transfer module in the imprinting apparatus of FIG. 1 located in a second position. FIG. 5C is a schematic view of operation between a transfer film and an imprinting roller when a film separation module drives the movable frame to be turned. For the sake of convenience of explanation, FIG. 1, FIG. 3, FIG. 5A, and FIG. 5B are shown in a partial perspective, and some members are omitted from FIG. 2A, FIG. 3, FIG. 4A, FIG. 5A, and FIG. 5B.

With reference to FIG. 1, FIG. 2A, and FIG. 3 together, in this embodiment, an imprinting apparatus 100 includes an imprinting platform 110, an imprinting roller 120, a transfer module 130, and a film separation module 140. The imprinting platform 110 has a first side 112 and a second side 114 opposite to each other. The imprinting roller 120 is disposed above the imprinting platform 110. The transfer module 130 includes a transfer film 132 and a fixed frame 134 and a movable frame 136 that clamp opposite sides of the transfer film 132. The transfer film 132 is located between the imprinting roller 120 and the imprinting platform 110. The fixed frame 134 is fixed beside the first side 112 of the imprinting platform 110, and the movable frame 136 is disposed on the second side 114 of the imprinting platform 110. Particularly, the movable frame 136 is adapted to move horizontally relative to the fixed frame 134 to change a flatness of the transfer film 132. The film separation module 140 is connected to the movable frame 136 of the transfer module 130, and is adapted to drive the movable frame 136 to be turned from a first position P1 (with reference to FIG. 5A) to a second position P2 (with reference to FIG. 5B), such that a rounded corner R is formed between the transfer film 132 and the imprinting roller 120 (with reference to FIG. 5C). That is to say, in this embodiment, the transfer film 132 fixed with the movable frame 136 may be turned by the film separation module 140 and varied in multiple angles, such that the imprinted product structure will not be damaged due to improper film separation, thereby increasing the imprinting yield and operating convenience.

To be specific, with reference to FIG. 1, FIG. 2A and FIG. 2B, the imprinting platform 110 of this embodiment is composed of a platform 111 and a wafer 113, and is, for example but not limited to, a precision six-axis imprinting platform. Since a levelness between the imprinting platform 110 and the imprinting roller 120 may largely affect a uniform depth of the imprinted structure, the imprinting apparatus 100 of this embodiment thus also includes two white light interferometers 150 separately disposed beside the first side 112 of the imprinting platform 110 to detect a height between the imprinting roller 120 and the imprinting platform 110. To be specific, in this embodiment, through a correction jig 10 placed on the imprinting platform 110, a focus F of light emitted by the two white light interferometers 150 may first be adjusted to be presented in a horizontal line P with the imprinting platform 110 as two points defining a line. Next, the levelness between the imprinting roller 120 and the imprinting platform 110 is corrected by utilizing the white light interferometers 150 to project light of different wavelengths. In addition to projecting light of different wavelengths, the white light interferometers 150 may also detect the transfer film 132 between the imprinting roller 120 and the imprinting platform 110, and may also penetrate the transfer film 132 and detect the imprinting roller 120 above. With the height data, the imprinting roller 120 may be adjusted to be horizontal with the imprinting platform 110.

Briefly speaking, in this embodiment, with the white light interferometers 150 that projects light of different wavelengths and penetrates transparent objects (e.g., the transfer film 132), the height of the imprinting platform 110 and the imprinting roller 120 may be detected. The white light interferometers 150 adjust and confirms the levelness between the imprinting platform 110 and the imprinting roller 120 by the focal points F of the two light sources defining a straight line. The white light interferometers 150 only requires to adjust the levelness once, and the level of the imprinting roller 120 and the imprinting platform 110 may be checked in advance at each time of imprinting. Besides, since a precision of the white light interferometers 150 reaches ±0.2 μm, an error in the levelness is relatively small.

Moreover, with reference to FIG. 3, the transfer film 132 of the transfer module 130 of this embodiment is clamped by the fixed frame 134 and the movable frame 136, and the transfer film 132 has a plurality of nanostructures thereon, which are adapted to be transferred to the imprinting platform 110 through the imprinting roller 120. The fixed frame 134, as its name suggests, is a fixed frame, while the movable frame 136 is a frame movable relative to the fixed frame 134. To be specific, the movable frame 136 of the transfer module 130 includes a first portion 136a, a second portion 136b, and a plurality of elastic element 136c. The elastic elements 136c are separately connected between the first portion 136a and the second portion 136b, and the opposite sides of the transfer film 132 are clamped between the fixed frame 134 and the first portion 136a of the movable frame 136. Herein, the elastic elements 136c include, for example but not limited to, springs. That is to say, the movable frame 136 of this embodiment may be regarded as a separate and freely bendable flexible film mounting jig, and a tensile force of the elastic elements 136c on the jig maintains the flatness of the transfer film 132.

With reference to FIG. 1 and FIG. 3 together, in order to effectively and accurately detect the tensile force of the elastic elements 136c, the imprinting apparatus 100 of this embodiment further includes at least one sensor 160 (two sensors 160 shown exemplarily) disposed beside the second portion 136b of the movable frame 136 and configured to detect a tensile force value of the elastic elements 136c. The sensor 160 is, for example, a tension-compression sensor, and converts a physical signal into an electrical signal with deformation of an elastic material (e.g., a piezoelectric material) for accurate measurement. Herein, the sensor 160 may be fastened on a bearing part 142 of the film separation module 140 through a cover 165 to effectively detect the tensile force value of the elastic elements 136c of the movable frame 136. Whether the tensile force reaches the required value and whether the tensile force on the left and right are adjusted to be consistent are completely determined by the tensile force value detected and displayed by the sensor 160. That is to say, the sensor 160 facilitates detection and adjustment of the tensile force of the transfer film 132 on the left and right to be uniform, and facilitates detection whether the tensile force value is maintained at the force required during imprinting, as well as observes changes in the tensile force when the second portion 136b of the movable frame 136 is operated relative to the first portion 136a. The sensor 160 converts a force exerted thereon into an electrical signal output. Since a precision of the sensor 160 reaches ±0.3% RO, an error in the detected tensile force value is small.

Briefly speaking, in this embodiment, the tensile force of the elastic elements 136c of the movable frame 136 of the transfer module 130 maintains the flatness of the transfer film 132, the tensile force is the same on the left side and the right side, and the required tensile force value is achieved, thereby bringing in an imprinting product with an excellent structure.

With reference to FIG. 4A, the imprinting apparatus 100 of this embodiment also includes a moving platform 171, a first pair of sliding rails S1, and a moving module 170. The first pair of sliding rails S1 is disposed on the moving platform 171. The moving module 170 is slidably disposed on the first pair of sliding rails S1, and includes a carrier 172 and a bracket 174 disposed on the carrier 172. The bracket 174 includes two first bracket parts 174a opposite to each other and a second bracket part 174b connected to the two first bracket parts 174a. The two first bracket parts 174a each have a bearing slot 175, and opposite ends 122 and 124 of the imprinting roller 120 are respectively disposed in the bearing slots 175. In order to effectively control a structural depth of the product, the imprinting apparatus 100 of this embodiment also includes two sensors 180. The two sensors 180 are respectively disposed in the bearing slots 175 and located between the ends 122 and 124 of the imprinting roller 120 and the bearing slot 175, and are configured to measure a pressure value of the imprinting roller 120.

To be specific, when the moving module 170 drives the imprinting roller 120 downward to be fitted with the imprinting platform 110, a state where the imprinting platform 110 abuts against the imprinting roller 120 is formed through the moving module 170 continuously downward. However, since the sensors 180 mounted on opposite sides of the imprinting roller 120 continue to move downward as the moving module 170 is operated, a reactive tensile force is formed between the imprinting roller 120 against which the imprinting platform 110 abuts and the sensors 180, and the reactive tensile force is equal to a downward pressure exerted by the imprinting roller 120 on the imprinting platform 110. Herein, the sensors 180 are, for example, tension-compression sensors, and converts a physical signal into an electrical signal with deformation of an elastic material (e.g., a piezoelectric material) for accurate measurement. That is to say, the sensors 180 may convert the deformation due to the exerted force of the imprinting roller 120 into an electrical signal output, and may effectively detect the pressure value of the imprinting roller 120 and facilitate adjustment of the downward pressure of the imprinting roller 120 to control the structural depth of the product.

Briefly speaking, during imprinting, the configuration of the sensors 180 facilitates detection of the downward pressure value of the imprinting roller 120 and determination whether the force exerted by the imprinting roller 120 on the left and right is uniform. Moreover, through the sensors 180, the downward pressure of the imprinting roller 120 may be adjusted, and then the imprinting depth of the product may be controlled. Besides, the sensors 180 convert a force exerted thereon into an electrical signal output, and since a precision of the sensors 180 reaches ±0.3% RO, an error in the detected exerted force value is small.

With reference to FIG. 4A and FIG. 4B together, in order to further adjust the downward pressure of the imprinting roller 120, the imprinting apparatus 100 of this embodiment also includes a second pair of sliding rails S2 and an adjustable lead screw 185. The moving module 170 also includes a support plate 176 disposed on the carrier 172. The second pair of sliding rails S2 is disposed on the support plate 176, and the second bracket part 174b is slidably disposed on the second pair of sliding rails S2. An extension direction of the first pair of sliding rails S1 is perpendicular to an extension direction of the second pair of sliding rails S2. The adjustable lead screw 185 is connected to the second bracket part 174b and configured to adjust a height difference between the bracket 174 and the carrier 172. Moreover, the imprinting apparatus 100 also includes a plurality of elastic elements 187 separately disposed between the two first bracket parts 174a of the bracket 174 and the carrier 172. Herein, a distance D is present between the imprinting platform 110 and the moving platform 171, and the elastic elements 187 include, for example but not limited to, compression springs.

To be specific, during nanoimprinting, the downward pressure of the imprinting roller 120 may be a parameter that affects the microstructure of the product. The moving module 170 of this embodiment may control rising or falling of the imprinting roller 120 through the adjustable lead screw 185, and then adjust the force exerted by the imprinting roller 120 on the imprinting platform 110. In addition, the imprinting force determines the depth of microstructure of the product, and sufficient downward pressure drives air bubbles inside the resist out of the product, such that the imprinted microstructure is not affected by the air bubbles, thereby increasing the yield of products. That is to say, in this embodiment, with rising or falling of the adjustable lead screw 185, the force exerted by the imprinting roller 120 downward on the imprinting platform 110 is adjusted, and the moving module 170 is moved through the first pair of sliding rails S1 to complete the imprinting. Herein, since the adjustable lead screw 185 achieves a fine adjustment of 10 μm upward and downward, the downward pressure of the imprinting roller 120 may be precisely controlled. Besides, the elastic elements 187 are disposed to serve as a support for the cantilever deformation of the imprinting roller 120, and adjust a damping force of the rising and falling of the adjustable lead screw 185. Briefly speaking, the imprinting roller 120 adjusts the downward pressure of the imprinting roller 120 by the rising or falling of the adjustable lead screw 185, thereby controlling a force of the imprinting, with sufficient downward pressure to solve air bubble residue.

Besides, with reference to FIG. 5A, the imprinting apparatus 100 of this embodiment also includes a pair of sliding rails S disposed beside a third side 116 and a fourth side 118 of the imprinting platform 110 that are opposite to each other, and the film separation module 140 is slidably disposed on the pair of sliding rails S. The film separation module 140 of this embodiment includes the bearing part 142 and a turning mechanism 144. The movable frame 136 of the transfer module 130 is assembled on the bearing part 142. The turning mechanism 144 includes two adjustable body parts 144a and two hinge parts 144b respectively connected to the two adjustable body parts 144a. The hinge parts 144b are respectively connected to opposite sides of the bearing part 142, and the two adjustable body parts 144a are adapted to slide along the pair of sliding rails S in a first direction D1 and are adapted to move along a second direction D2 perpendicular to the first direction D1 to adjust a distance between the transfer film 132 and the imprinting platform 110.

To be specific, with reference to FIG. 5A again, when film separation is required for the transfer film 132 after imprinting, at this time, the movable frame 136 connected to the bearing part 142 of the film separation module 140 is located in the first position P1. Next, with reference to FIG. 5B and FIG. 5C together, the turning mechanism 144 of the film separation module 140 drives the movable frame 136 and the transfer film 132 fixed with the movable frame 136 to be turned such that the rounded corner R is formed between the transfer film 132 and the imprinting roller 120, and the movable frame 136 is located in the second position P2. At this time, the imprinting roller 120 and the turning mechanism 144 move to the left (i.e., to the first side 112 of the imprinting platform 110) at substantially the same speed, and the rounded corner R may offset a pulling force when the transfer film 132 is separated from a product 20, such that the structures of the transfer film 132 and the product 20 can be separated smoothly. That is to say, the imprinting apparatus 100 of this embodiment includes the movable frame 136, which can be freely bent, the film separation module 140, which turns and bends the transfer film 132 and adjusts the angle/height to perform separation between the transfer film 132 and the product 20, and the imprinting roller 120, of which continuous peeling of the rounded corner R prevents damage to the imprinted product 20 due to separation by a fierce pull, thereby increasing the imprinting yield. In other words, in this embodiment, with the mechanical design of the film separation module 140, film separations with great variations may thus be performed and adjustment to the most suitable film separation angle may be achieved, preventing improper damage to the microstructure of the product by the transfer film 132 and increasing the yield of products. Besides, in this embodiment, in addition to turning the transfer film 132 and varying the same in multiple angles, the film separation module 140 may also adjust various film separations, in combination with the turning mechanism 144 that moves in the second direction D2 to fine-tune the distance between the transfer film 132 and the imprinting platform 110, namely a height to which the turning mechanism 144 may rise. Therefore, the imprinted product structure would not be damaged due to improper film separation, thereby increasing the imprinting yield.

Briefly speaking, the film separation module 140 of this embodiment may turn the transfer film 132 fixed with the movable frame 136 and vary the transfer film 132 in multiple angles, and achieves adjustment to the most suitable film separation angle, such that the imprinted product structure would not be damaged due to improper film separation, thereby increasing the imprinting yield and operating convenience. Moreover, in this embodiment, through the white light interferometers 150, levelness between the imprinting platform 110 and the imprinting roller 120 is precisely achieved, through the sensor 160, the tensile force of the elastic elements 136c of the movable frame 136 of the transfer module 130 can be accurately detected, and through the sensors 180, the pressure value of the imprinting roller 120 is effectively detected and the downward pressure of the imprinting roller 120 is adjusted, thereby controlling the structural depth of the product. Besides, the downward pressure of the imprinting roller 120 may also be adjusted through the rising or falling of the adjustable lead screw 185, thereby controlling the force of the imprinting, with sufficient downward pressure to solve air bubble residue. In other words, in this embodiment, the imprinting and film separation of the imprinting apparatus 100 are optimized, thereby increasing the imprinting yield and operating convenience of the imprinting apparatus 100. In addition, through the above-mentioned mechanical design, the imprinting apparatus 100 of this embodiment adjusts film separation with a high degree of freedom, and can find out the most suitable peeling manner for the product 20 and the transfer film 132. Moreover, the multi-axis structure facilitates detailed testing and fine-tuning, preventing damage to the imprinted product 20 due to improper film separation in a single way, and increasing the yield of products.

Notably, the reference numerals and part of the contents in the above embodiments remain to be used in following embodiment, where the same reference numerals are adopted to refer to the same or similar elements, and description of the same technical contents is omitted. Reference may be made to the above embodiments for the description of the omitted part, which will not be repeatedly described in the following embodiment.

Figure 6A:
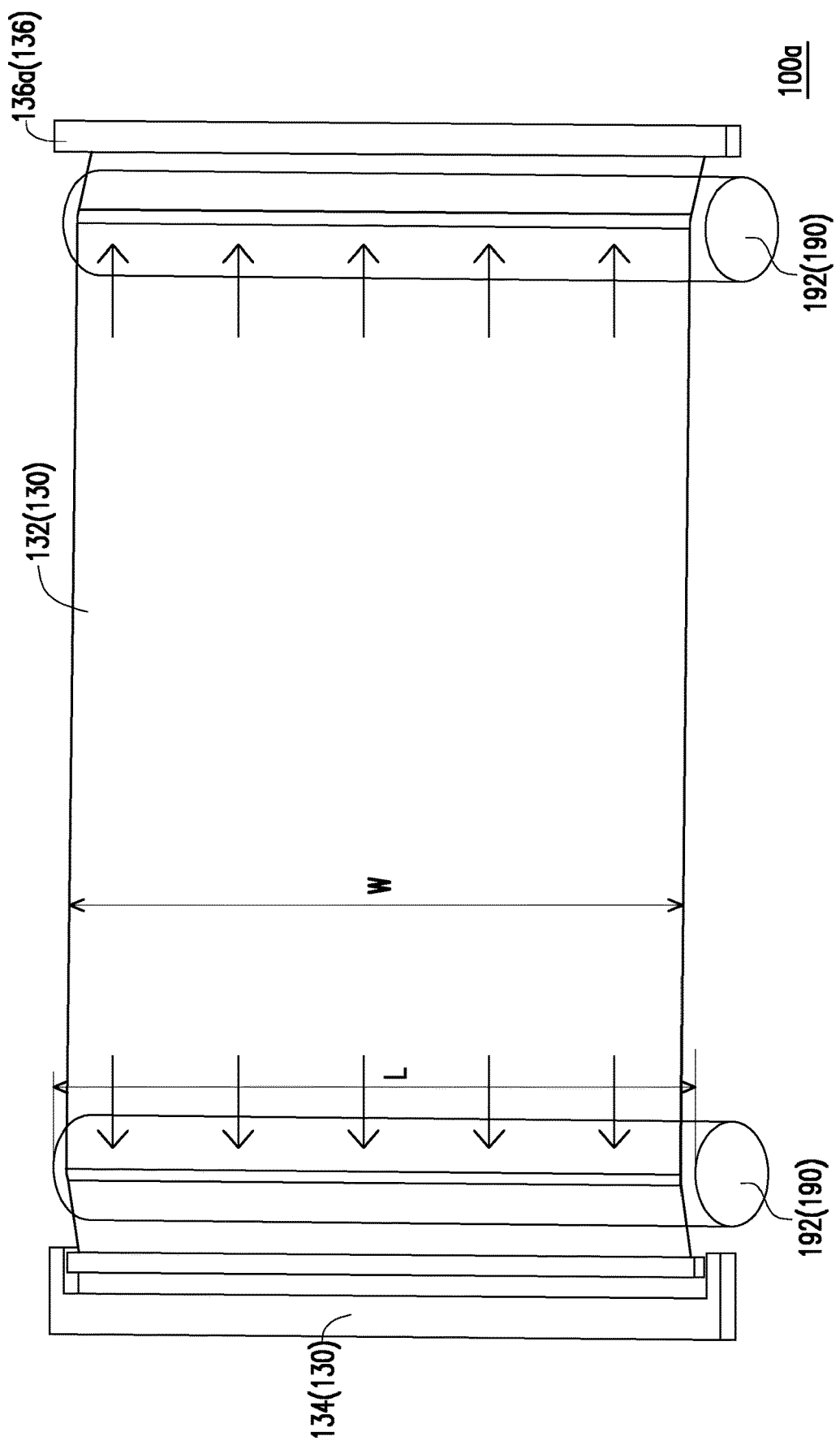
FIG. 6A is a schematic top view of an imprinting apparatus according to another embodiment of the disclosure.
Figure 6B:
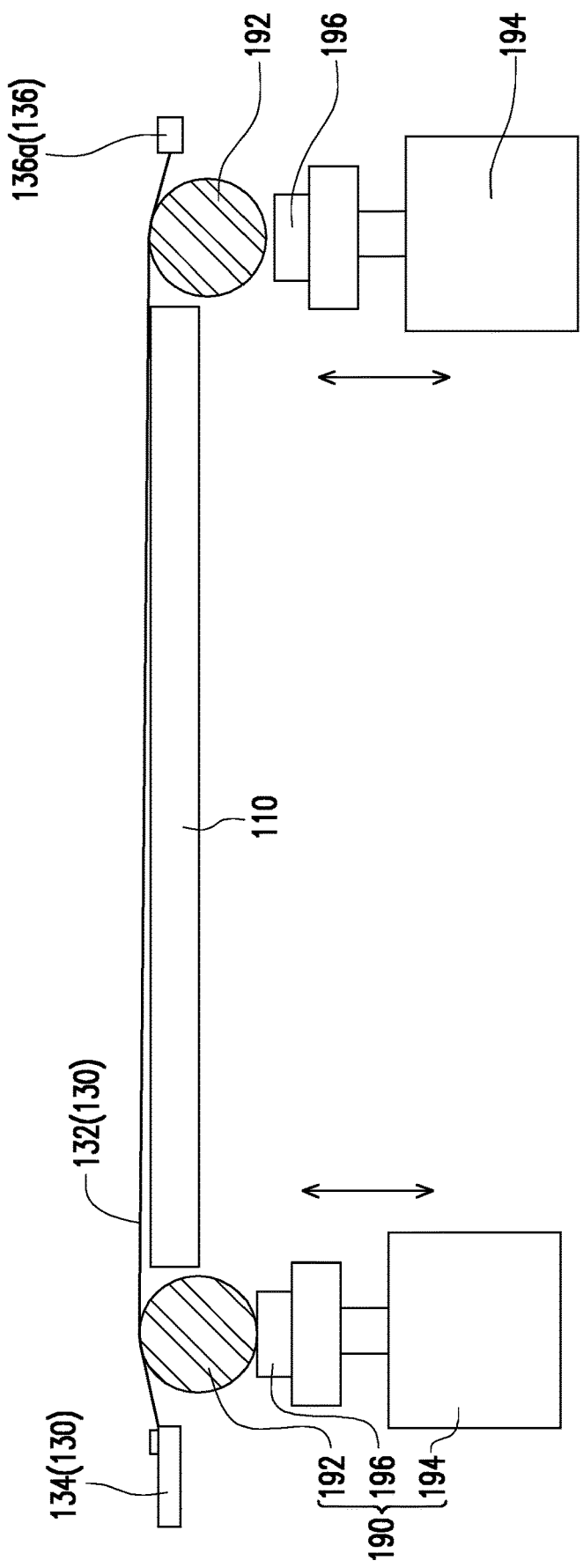
FIG. 6B is a schematic side view of the imprinting apparatus of FIG. 6A.

FIG. 6A is a schematic top view of an imprinting apparatus according to another embodiment of the disclosure. FIG. 6B is a schematic side view of the imprinting apparatus of FIG. 6A. For ease of description, only part of the members are schematically illustrated in FIG. 6A and FIG. 6B, and reference may be made to the relevant drawings to the above embodiments for the omitted part. With reference to FIG. 3-FIG. 6A, and FIG. 6B together, an imprinting apparatus 100a of this embodiment is similar to the imprinting apparatus 100, and is different in that the imprinting apparatus 100a of this embodiment also includes a tensile force adjustment mechanism 190, which includes two rods 192 and two lifting machines 194. An extension direction of the two rods 192 is parallel to an extension direction of the imprinting roller 120. The two rods 192 are in contact against the transfer film 132 and are respectively located between of the fixed frame 134 of the transfer module 130 and the imprinting platform 110 and between the first portion 136a of the movable frame 136 of the transfer module 130 and the imprinting platform 110. The two lifting machines 194 respectively adjust lifted heights of the two rods 192, and the transfer film 132 is pulled open through lifting by the two rods 192 to generate a tensile force. In other words, the rods 192 at the longitudinal front and back may be lifted by using the lifting machines 194 (e.g., an electric cylinder) to tighten the transfer film 132 and generate a tensile force. In addition, the strength of the tensile force of the transfer film 132 at the front and back may be independently adjusted depending on the lifted heights of the rods 192.

Moreover, the tension adjustment mechanism 190 of this embodiment also includes two tensile force sensors 196. The two tensile force sensors 196 are respectively disposed between the two rods 192 and the two lifting machines 194, and may be configured to detect a real-time tensile force of the transfer film 132. Preferably, in this embodiment, a length L of each of the rods 192 is greater than a width W of the transfer film 132. In this embodiment, since the length L of the rods 192 is greater than the width of the transfer film 132, and the rods 192 are in contact against the transfer film 132 to form an even tensile force along a straight line, the tensile force may be evenly transmitted to lateral sides (i.e., along the directions of the arrows in FIG. 6A) of the transfer film 132.

Briefly speaking, in the mechanism of the tension adjustment mechanism 190 of this embodiment, the two rods 192 are mounted at the longitudinal front and back of the transfer film 132, and the transfer film is pulled open using the lifting by the rods 192 to generate the tensile force. Beneath the rods 192, the tensile force sensors 196 may be additionally mounted to detect the real-time tensile force of the transfer film 132, and the tightness (i.e., the tensile force) is adjusted with the lifting amplitude of the rods 192. Furthermore, since each of the rods 192 is disposed corresponding to one lifting machine 194, longitudinal front and back sides of the transfer film 132 may be independently adjusted. In addition, since the length L of each of the rods 192 is greater than the width W of the transfer film 132, when the rods 19 pull open the transfer film 132 in a linear manner, the tensile force are formed along a straight line and evenly distributed on the lateral sides of the transfer film 132.

Figure 7A:
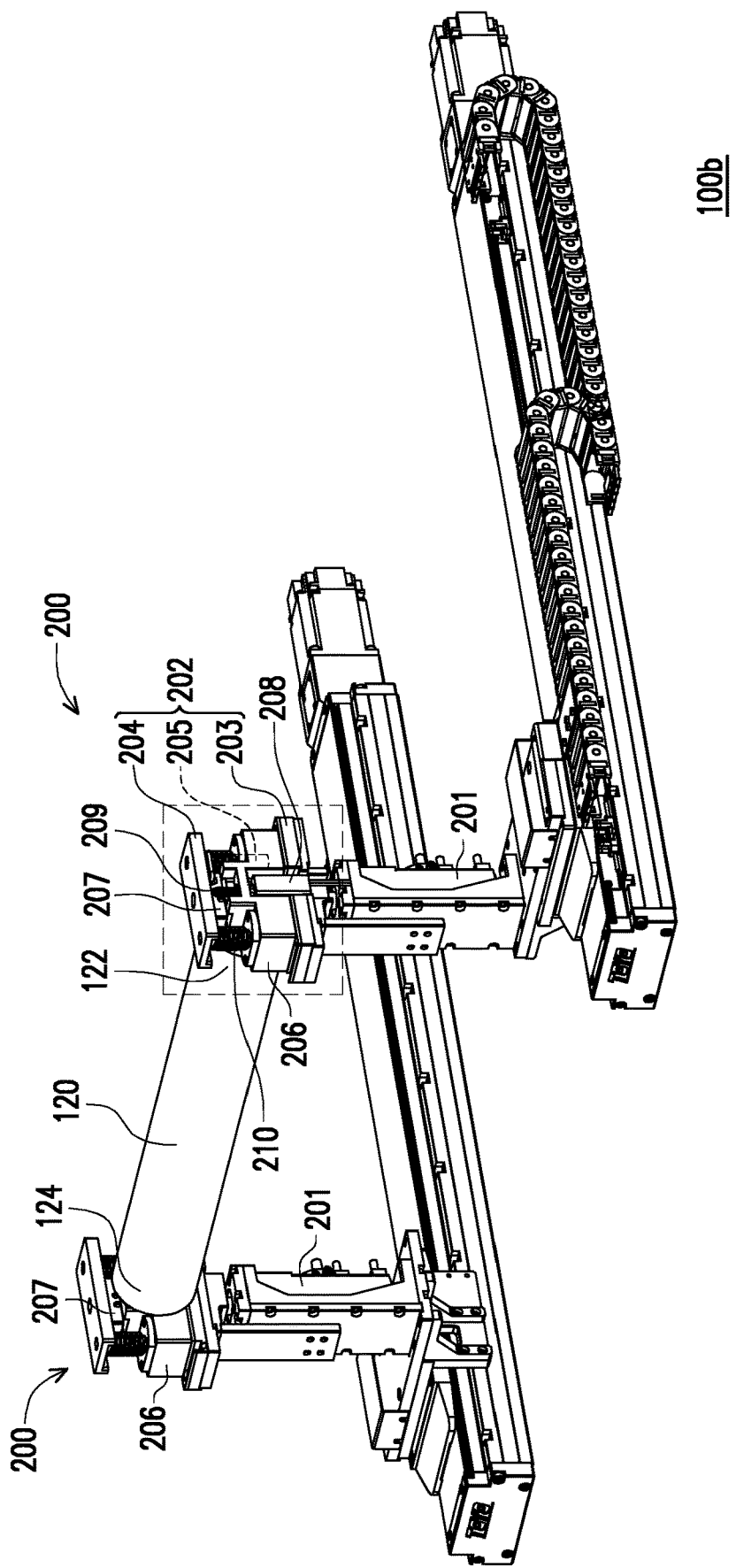
FIG. 7A is a partial view of an imprinting apparatus according to another embodiment of the disclosure.
Figure 7B:
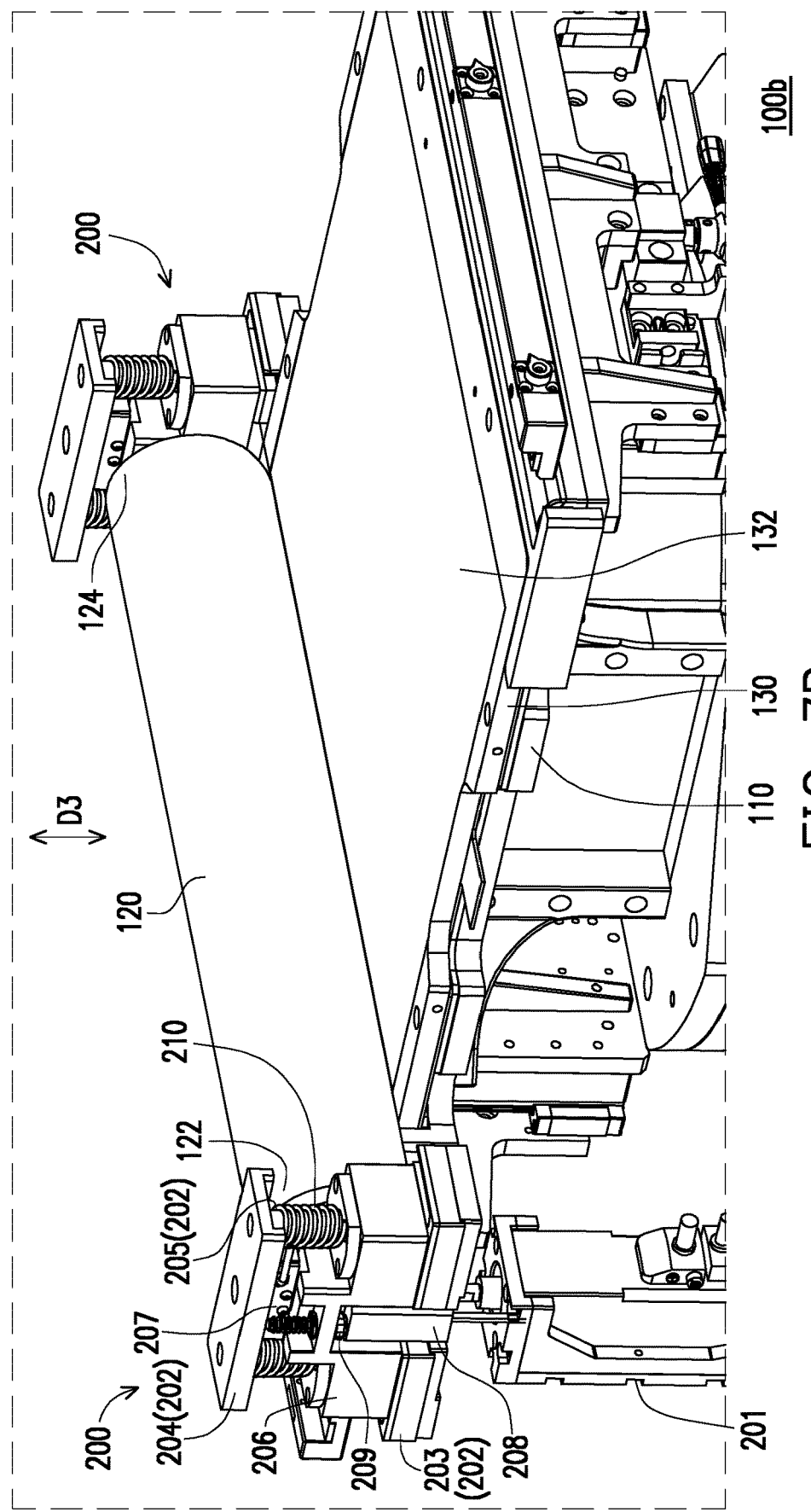
FIG. 7B is a partial view of the imprinting apparatus of FIG. 7A with different view angle.
Figure 7C:
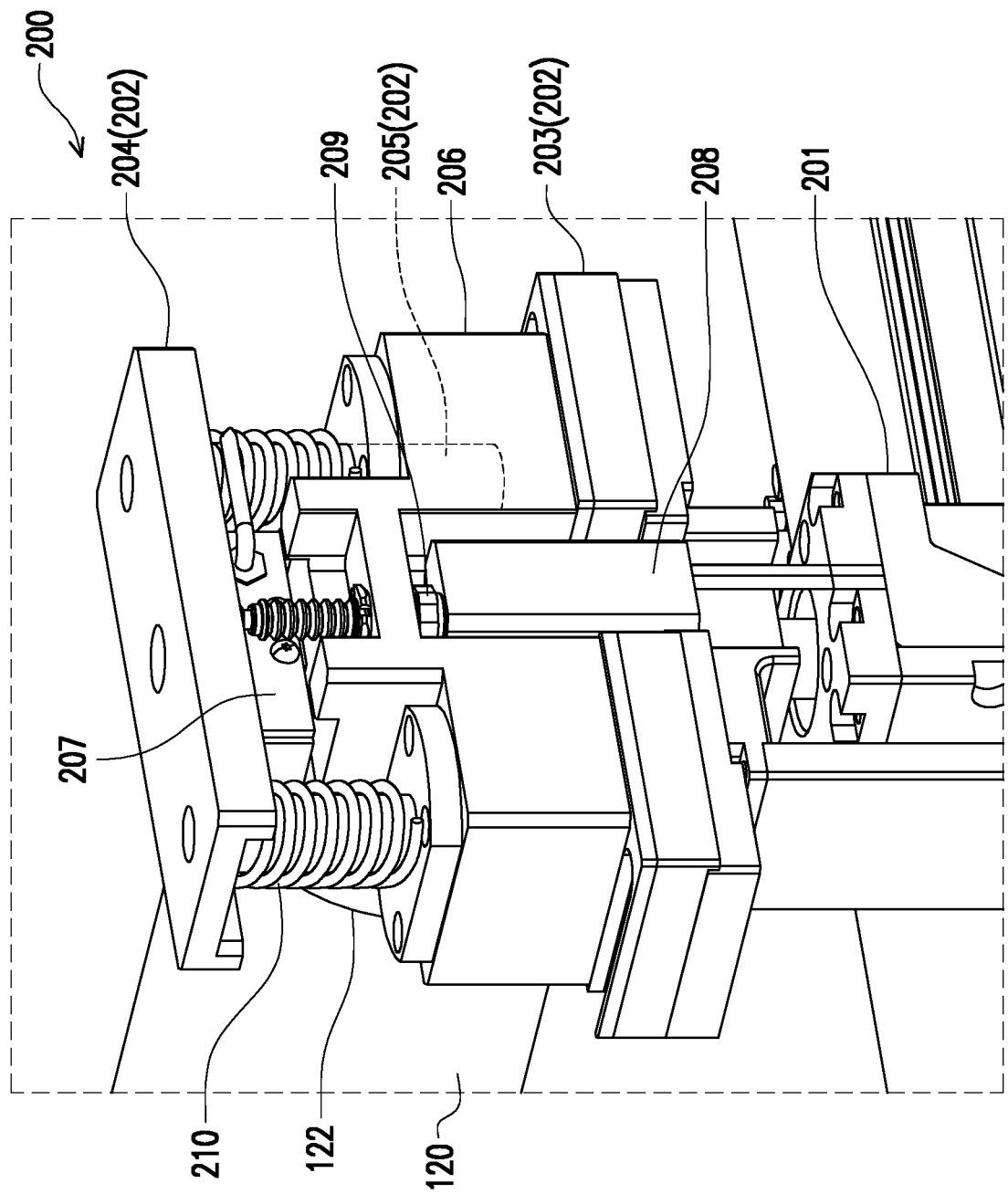
FIG. 7C is a partial enlarged view of the lifting and pressing mechanism of FIG. 7A.

FIG. 7A is a partial view of an imprinting apparatus according to another embodiment of the disclosure. FIG. 7B is a partial view of the imprinting apparatus of FIG. 7A with different view angle. FIG. 7C is a partial enlarged view of the lifting and pressing mechanism of FIG. 7A.

Referring to FIGS. 7A-7C, in the embodiment, the imprinting apparatus 100b includes an imprinting platform 110 (FIG. 7B), an imprinting roller 120, a transfer module 130 (FIG. 7B) and at least one lifting and pressing mechanism 200. As shown in FIG. 7B, the imprinting roller 120 is disposed above the imprinting platform 110. The transfer module 130 includes a transfer film 132, and the transfer film 132 is located between the imprinting roller 120 and the imprinting platform 110.

In the embodiment, number of the at least one lifting and pressing mechanism 200 is two, the two lifting and pressing mechanisms 200 at located at two ends 122, 124 of the imprinting roller 120 so as to be linked with the imprinting roller 120. That is, the lifting and pressing mechanisms 200 drive the imprinting roller 120 to move along a normal direction D3 of the imprinting platform 110 and selectively pressurize the imprinting roller 120. In the embodiment, the two lifting and pressing mechanisms 200 are the same, so the description below only mentions one of the lifting and pressing mechanism 200.

Specifically, as shown in FIG. 7C, in the embodiment, the lifting and pressing mechanism 200 includes a driving source 201, a base 202 connected to the driving source 201, a holder 206 disposed at an end 122 (FIG. 8C) of the imprinting roller 120 and located in the base 202. The base 202 includes a lower part 203, an upper part 204 and a guide post 205 located between and connected to the lower part 203 and the upper part 204, the guide post 205 extends along the normal direction D3, the holder 206 is slidably disposed at the guide post 205. A spring 210 is sleeved on the guide post 205 and presses the holder 206 so as to stabilize the movement of the holder 206.

Figure 8A:
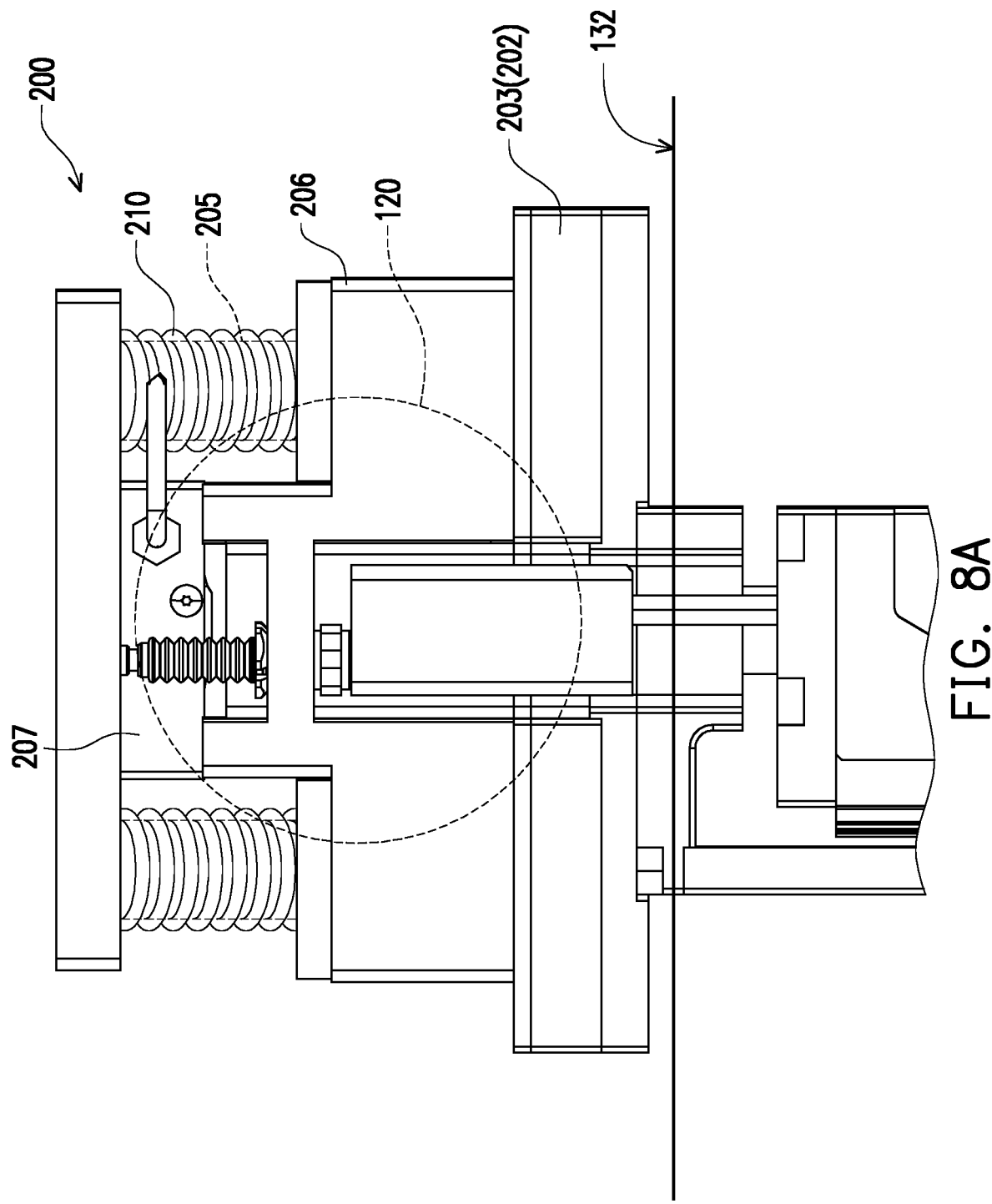
FIG. 8A is a partial side view of the lifting and pressing mechanism of FIG. 7A.

FIG. 8A is a partial side view of the lifting and pressing mechanism of FIG. 7A. Referring to FIG. 8A, the imprinting roller 120 (dotted line) is located above the transfer film 132 located on the imprinting platform 110 (FIG. 7B), and does not contact the transfer film 132 yet.

Figure 8B:
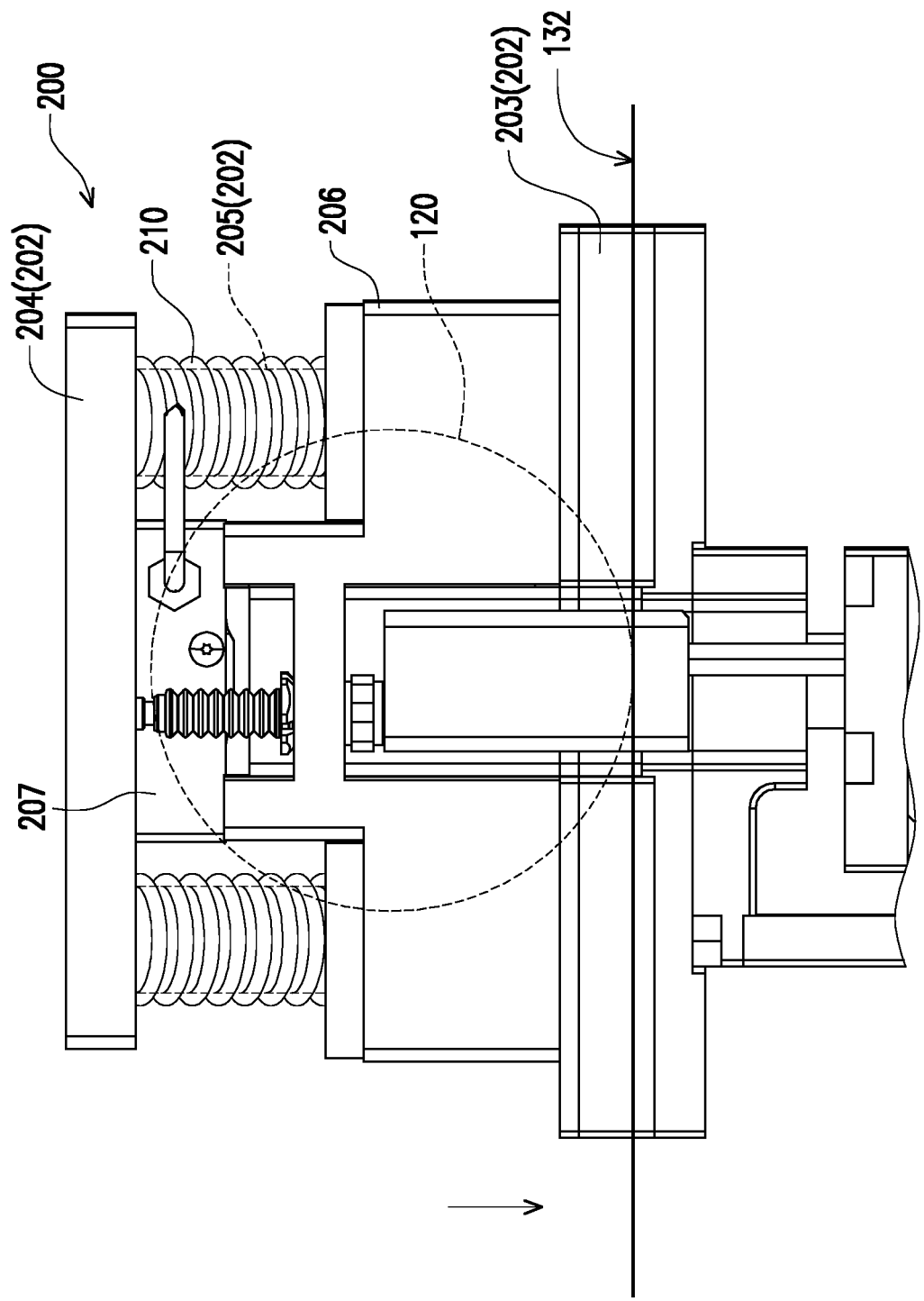
FIG. 8B is a schematic view of the lifting and pressing mechanism of FIG. 8A located at the first position.
Figure 8C:
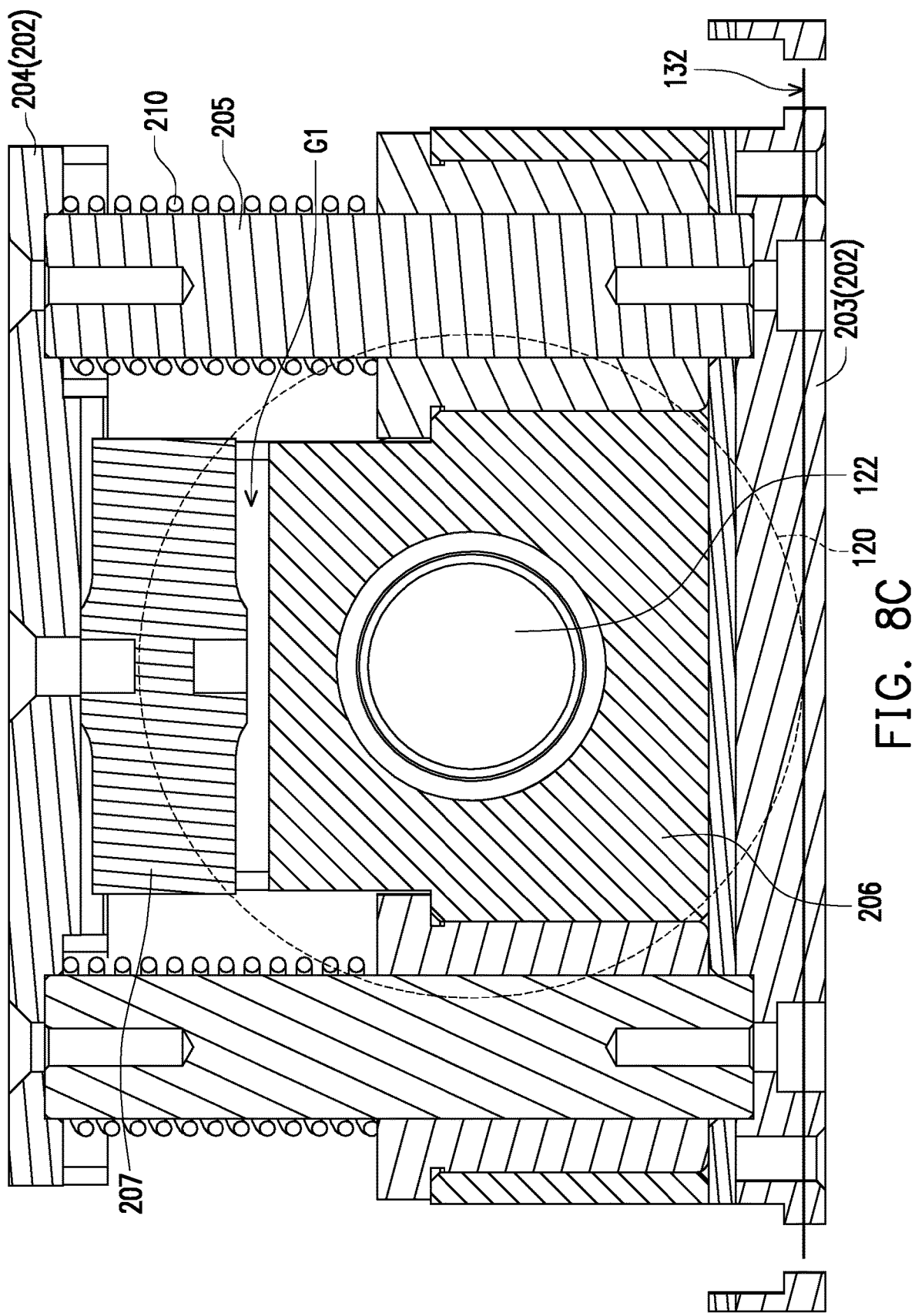
FIG. 8C is a cross-sectional view of FIG. 8B.

FIG. 8B is a schematic view of the lifting and pressing mechanism of FIG. 8A located at the first position P1'. FIG. 8C is a cross-sectional view of FIG. 8B. Referring to FIGS. 8B-8C, when the imprinting roller 120 is moved by the lifting and pressing mechanism 200 downwardly to a first position P1', the imprinting roller 120 contacts the transfer film 132 located on the imprinting platform 110.

As shown in FIG. 8C, the lifting and pressing mechanism 200 further includes a pressure sensor 207 fixed to the upper part 204 of the base 202 and located between the upper part 204 of the base 202 and the holder 206. When the imprinting roller 120 is at the first position P1', the holder 206 contacts the lower part 203 of the base 202, and a gap G1 is formed between the holder 206 and the pressure sensor 207. That is, in the first position P1', the imprinting roller 120 is not pressurized by the upper part 204 of the base 202 of the lifting and pressing mechanism 200 through the pressure sensor 207, the imprinting roller 120 is placed on the transfer film 132 and the imprinting platform 110 naturally, and the transfer film 132 and the imprinting platform 110 is pressed only or mainly by its own weight of the imprinting roller 120. Because the pressure sensor 207 is not pressed, the value detected by the pressure sensor 207 is approximately zero.

In the embodiment, the gap G1 between the holder 206 and the pressure sensor 207 provides the room for the imprinting roller 120 to move upwardly. Therefore, a position of the imprinting roller 120 along the normal direction D3 can be adjustable according to the topography of the imprinting platform 110, such that the transfer film 132 and the imprinting platform 110 can be pressed by the imprinting roller 120 evenly.

Figure 8D:
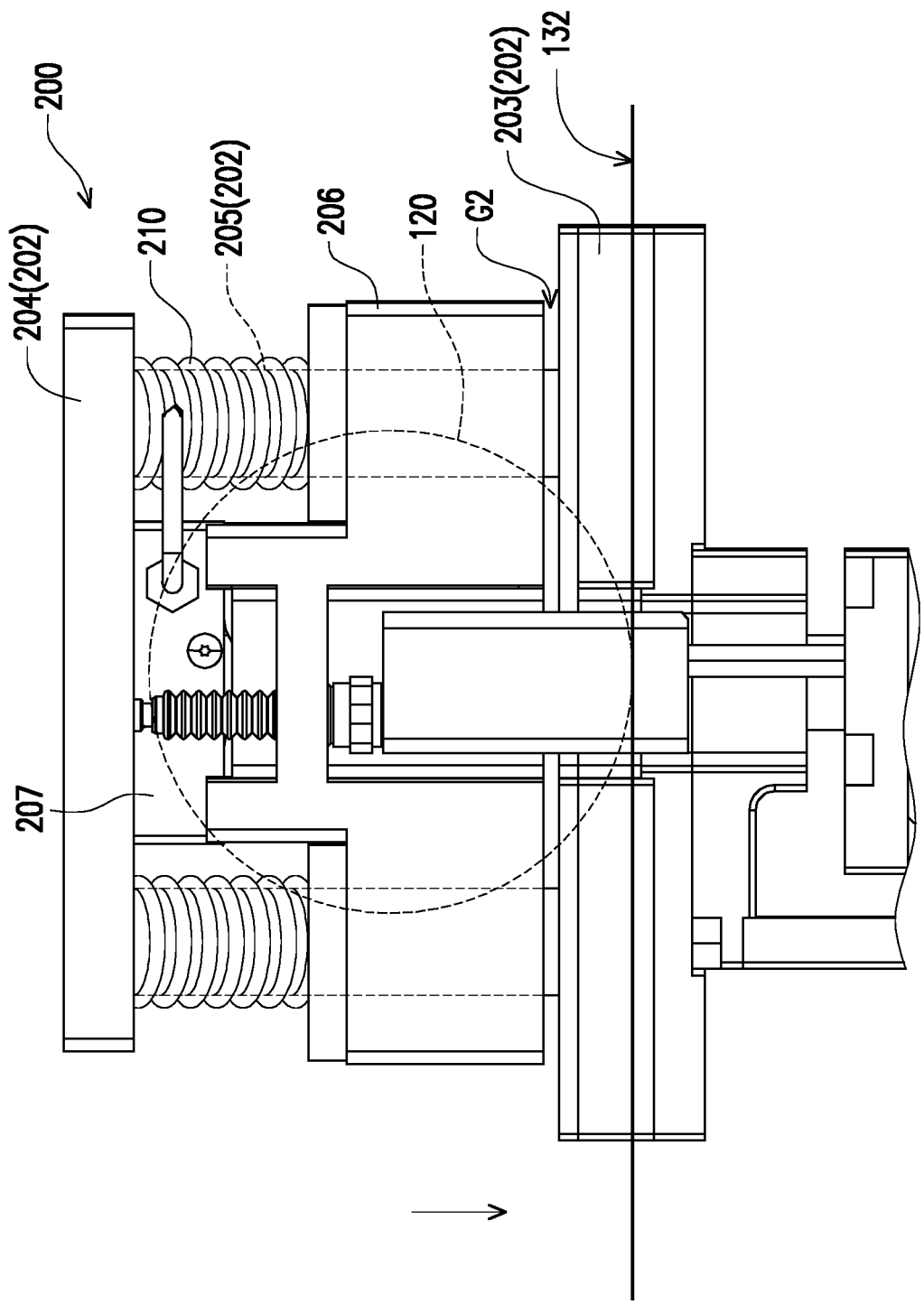
FIG. 8D is a schematic view of the lifting and pressing mechanism of FIG. 8A located at the second position.
Figure 8E:
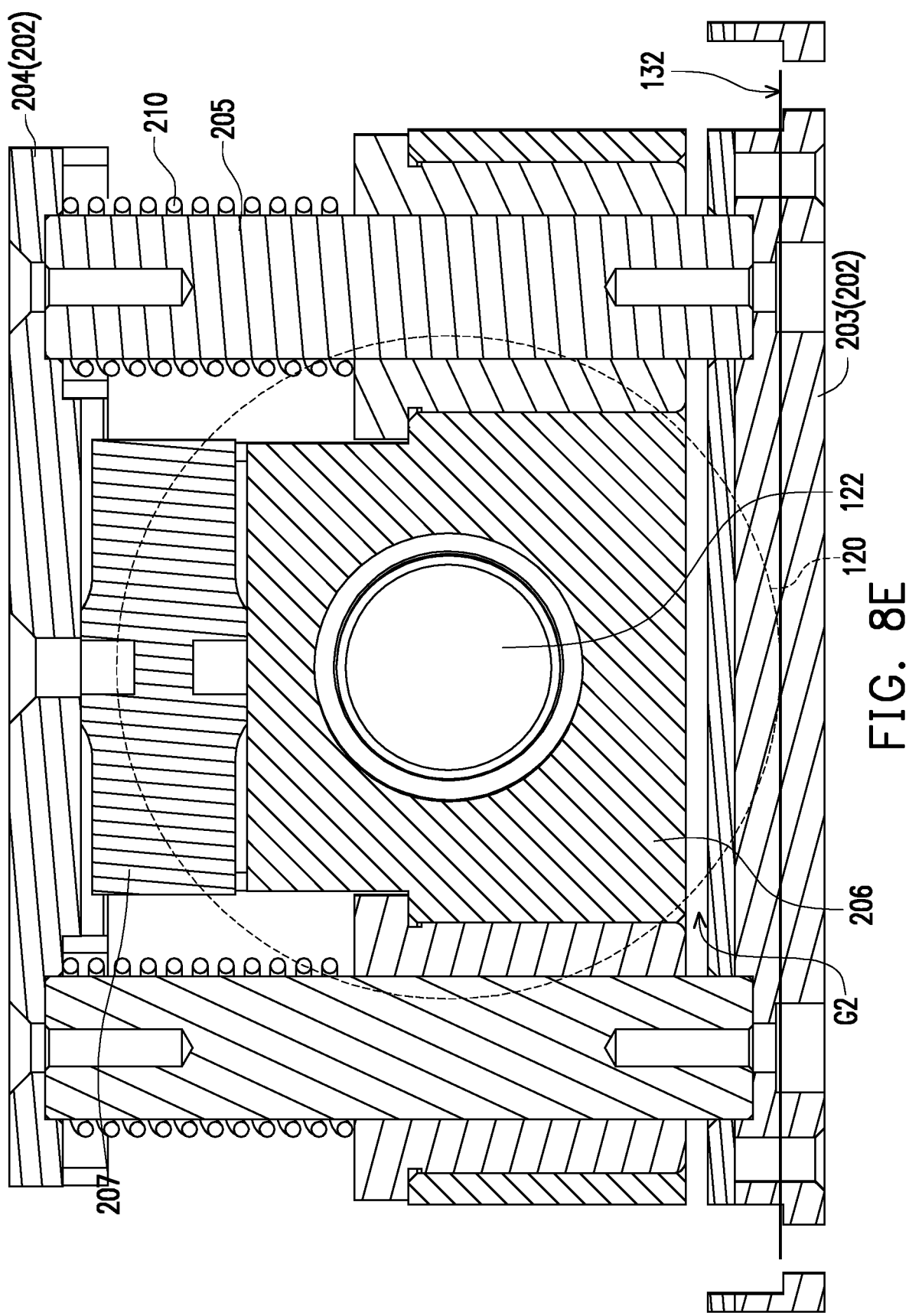
FIG. 8E is a cross-sectional view of FIG. 8D.

FIG. 8D is a schematic view of the lifting and pressing mechanism of FIG. 8A located at the second position P2'. FIG. 8E is a cross-sectional view of FIG. 8D. Referring to FIGS. 8D-8E, when the weight of the imprinting roller 120 applied on the transfer film 132 and the imprinting platform 110 is not enough, the imprinting roller 120 is selectively moved by the lifting and pressing mechanism 200 downwardly to a second position P2'. In the second position P2', the imprinting roller 120 is pressurized by the upper part 204 of the base 202 of the lifting and pressing mechanism 200 through the pressure sensor 207. As shown in FIG. 8E, the pressure sensor 207 contacts and presses the holder 206, so that the value detected by the pressure sensor 207 is not zero. A gap G2 is formed between the lower part 203 of the base 202.

In other words, when the imprinting roller 120 is at the second position P2', the upper part 204 of the base 202 of the lifting and pressing mechanism 200 pressurizes the imprinting roller 120, such that the transfer film 132 and the imprinting platform 110 is pressed by a combination of the weight of the imprinting roller 120 and a pressure of the lifting and pressing mechanism 200.

Therefore, in the embodiment, the imprinting roller 120 can provide more versatile and flexible imprinting pressure onto the transfer film 132 and the imprinting platform 110 through the lifting and pressing mechanism 200.

Please back to FIG. 7A, in the embodiment, the lifting and pressing mechanisms 200 further includes two levelness detectors 208 located at the two ends 122, 124 of the imprinting roller 120. The two levelness detectors 208 are used for measuring the levelness of the imprinting roller 120. As shown in FIG. 7C, a screw 209 leans against the levelness detector 208 and the upper part 204 of the base 202, such that a surface of the screw 209 contacting the levelness detector 208 forms a datum surface for the levelness detector 208. In addition, the levelness detectors 208 contact the ends 122, 124 of the imprinting roller 120 so as to obtain the height information of the ends 122, 124 of the imprinting roller 120, such that the levelness of the imprinting roller 120 can be obtained.

Figure 9A:
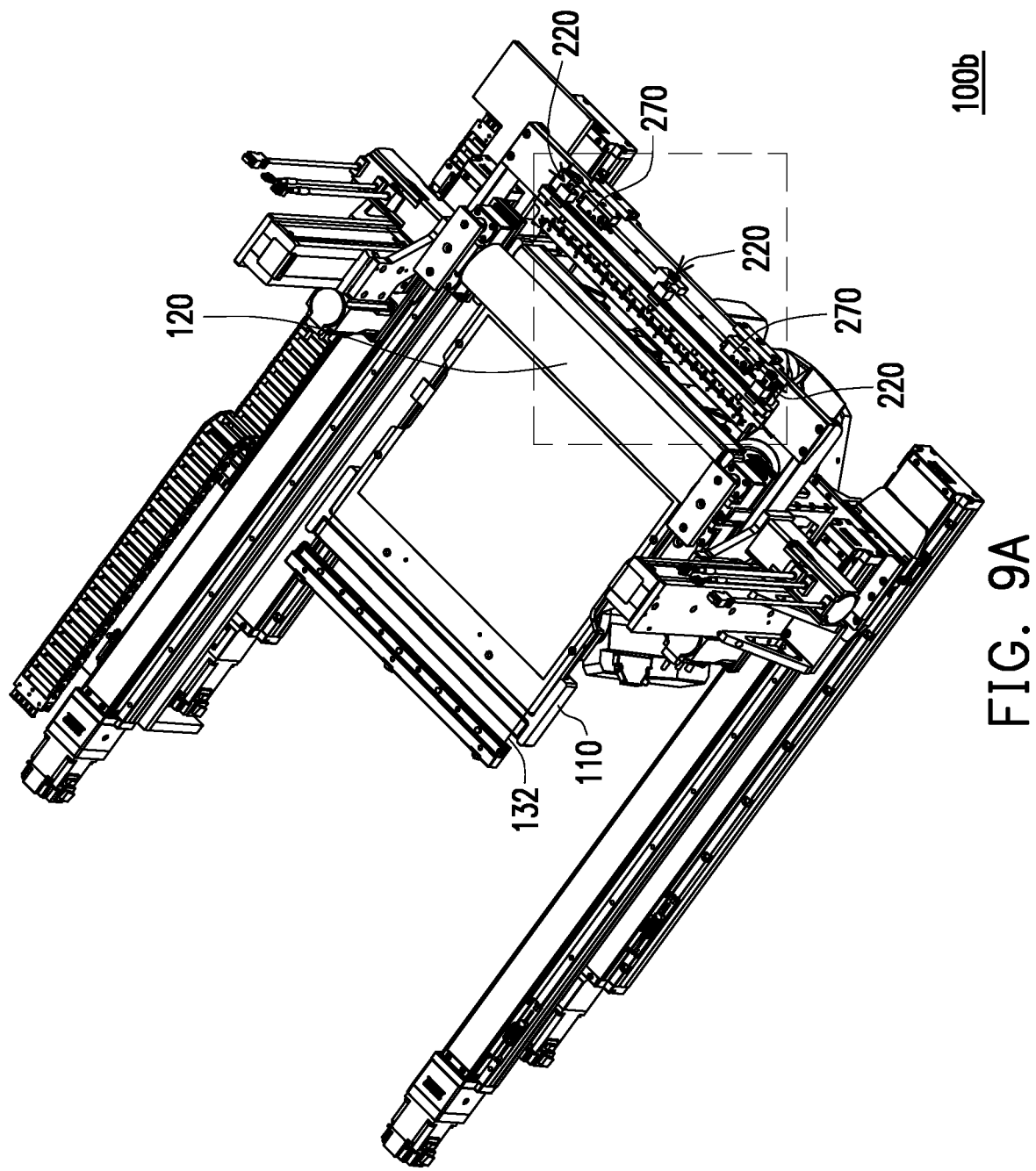
FIG. 9A is a partial view of the imprinting apparatus of FIG. 7A with different view angle.

FIG. 9A is a partial view of the imprinting apparatus of FIG. 7A with different view angle. FIG. 9B is a partial enlarged view of the fixing module of FIG. 9A. Referring to FIGS. 9A and 9B, the imprinting apparatus 100b further includes a film separation module 140b and a fixing module 220, wherein the transfer module 130 includes a frame 138, the transfer film 132 is disposed at the frame 138. The frame 138 can be the second portion 136b of the transfer module 130, but the type of the frame 138 is not limited thereto. The frame 138 is detachably disposed at the film separation module 140b by the fixing module 220. In the embodiment, the fixing module 220 is a toolless module which has quick assembling and quick releasing function, detail description is mentioned below.

FIG. 9C is an exploded view of the fixing module of FIG. 9B. Referring to FIG. 9C, the fixing module 220 includes a first fixing member 221 fixed at the film separation module 140b, a second fixing member 230 fixed at the frame 138, a first rotating member 240 passing through a first hole 146 of the film separation module 140b and located at a side of the first fixing member 221, and a second rotating member 250 passing through the first fixing member 221 and located between the first rotating member 240 and the second fixing member 230.

In the embodiment, the first rotating member 240 includes a knob 242 exposed from the film separation module 140b, a first main body 244 having a slot 246, and a first blocking member 248 extend 122ing from the first main body 244 to a direction away from the knob 242. The first main body 244 passes through the first hole 146 of the film separation module 140b.

The first fixing member 221 includes a second main body 222, a second hole 224 formed on the second main body 222 and corresponding to the first hole 146 and a second blocking member 225 protruding from a surface 223 of the second main body 222 towards the first rotating member 240.

The second rotating member 250 includes a third main body 251, a protrusion 254 and and a locking part 255. The third main body 251 passes through the second hole 224 of the first blocking member 248 and has a first side 252 close to the first rotating member 240 and a second side 253 close to the second fixing member 230. The protrusion 254 is located on an outer surface 223 of the third main body 251, near the first side 252 and inserted into the slot 246 of the first rotating member 240. Hence, the second rotating member 250 can be rotated along with the first rotating member 240 due to the engagement of the slot 246 and the protrusion 254. In addition, the locking part 255 is located at the second side 253 of the third main body 251.

The second fixing member 230 includes an inner space 232 and a positioning hole 234 communicated with the inner space 232.

Figure 10A:
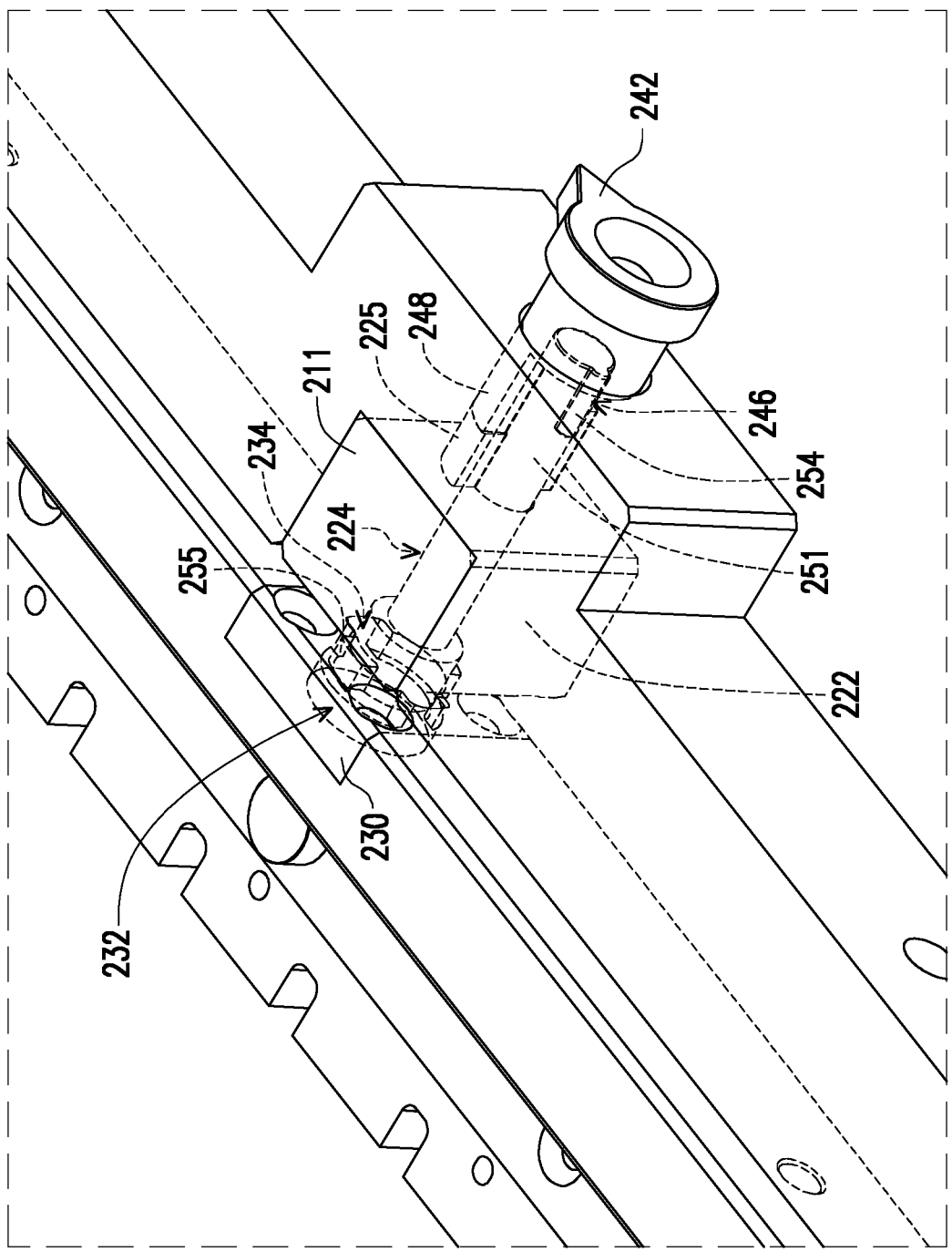
FIGS. 10A-10D are schematic views of a locking process of the fixing module of FIG. 9B.

FIGS. 10A-10D are schematic views of a locking process of the fixing module of FIG. 9B. Referring to FIG. 10A first, when the first rotating member 240 is located at an original position, the first blocking member 248 of the first rotating member 240 is aligned with the second blocking member 225 of the first fixing member 221, such that a movement of the first rotating member 240 towards the first fixing member 221 is limited by the second blocking member 225. Therefore, the first rotating member 240 cannot be pushed towards the first fixing member 221.

In addition, in FIG. 10A, the locking part 255 of the second rotating member 250 extends along a vertical direction, and the positioning hole 234 of the second fixing member 230 extends along a horizontal direction. That is, the locking part 255 of the second rotating member 250 does not align with the positioning hole 234 of the second fixing member 230 yet.

Figure 10B:
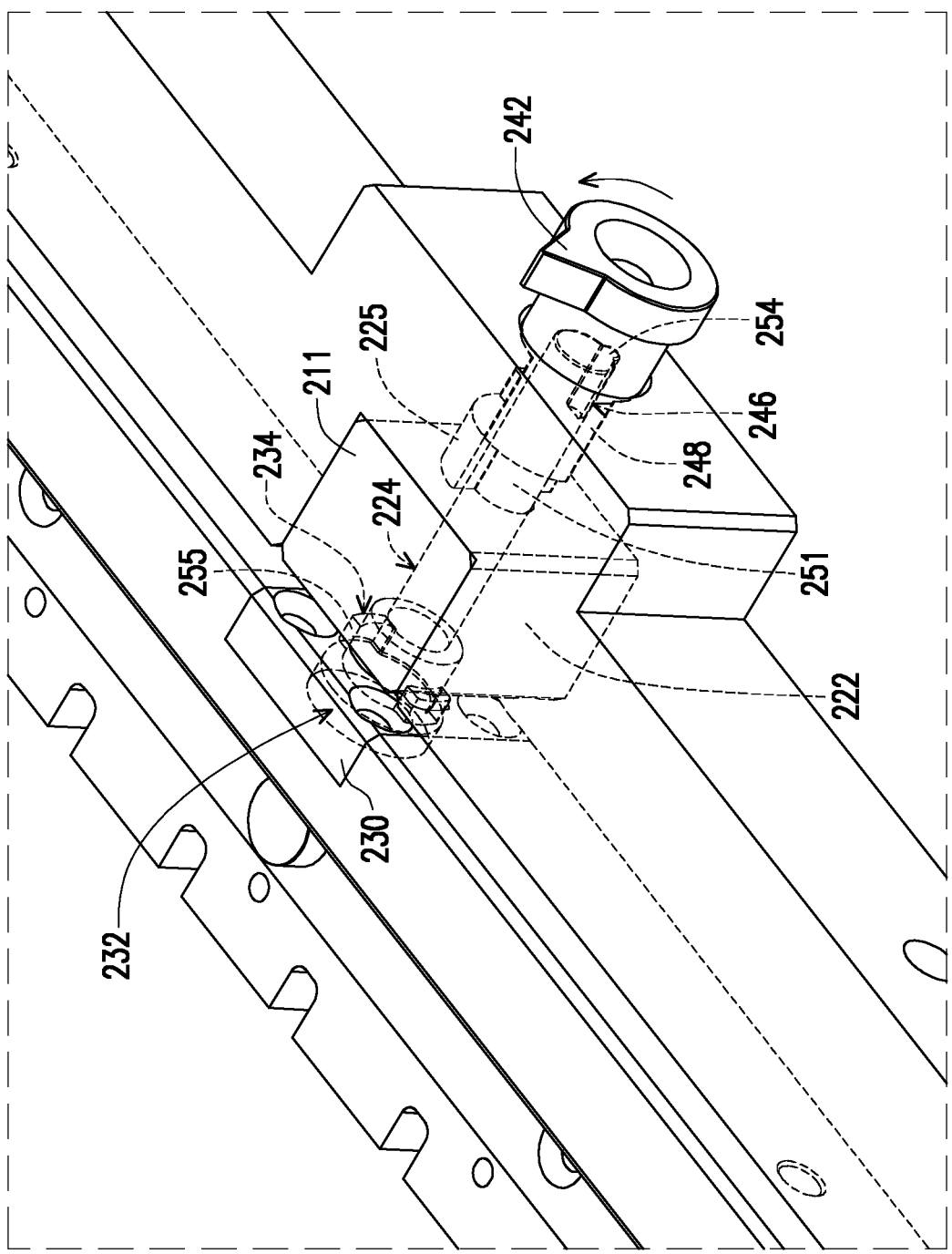

Referring to FIG. 10B, when the first rotating member 240 is rotated to a position that the first blocking member 248 is staggered with the second blocking member 225, the first rotating member 240 is adapted to move towards the surface 223 of the second main body 222. In FIG. 10B, the second rotating member 250 is rotated such that the locking part 255 of the second rotating member 250 extends along the horizontal direction. The locking part 255 of the second rotating member 250 is aligned with the positioning hole 234 of the second fixing member 230.

Figure 10C:
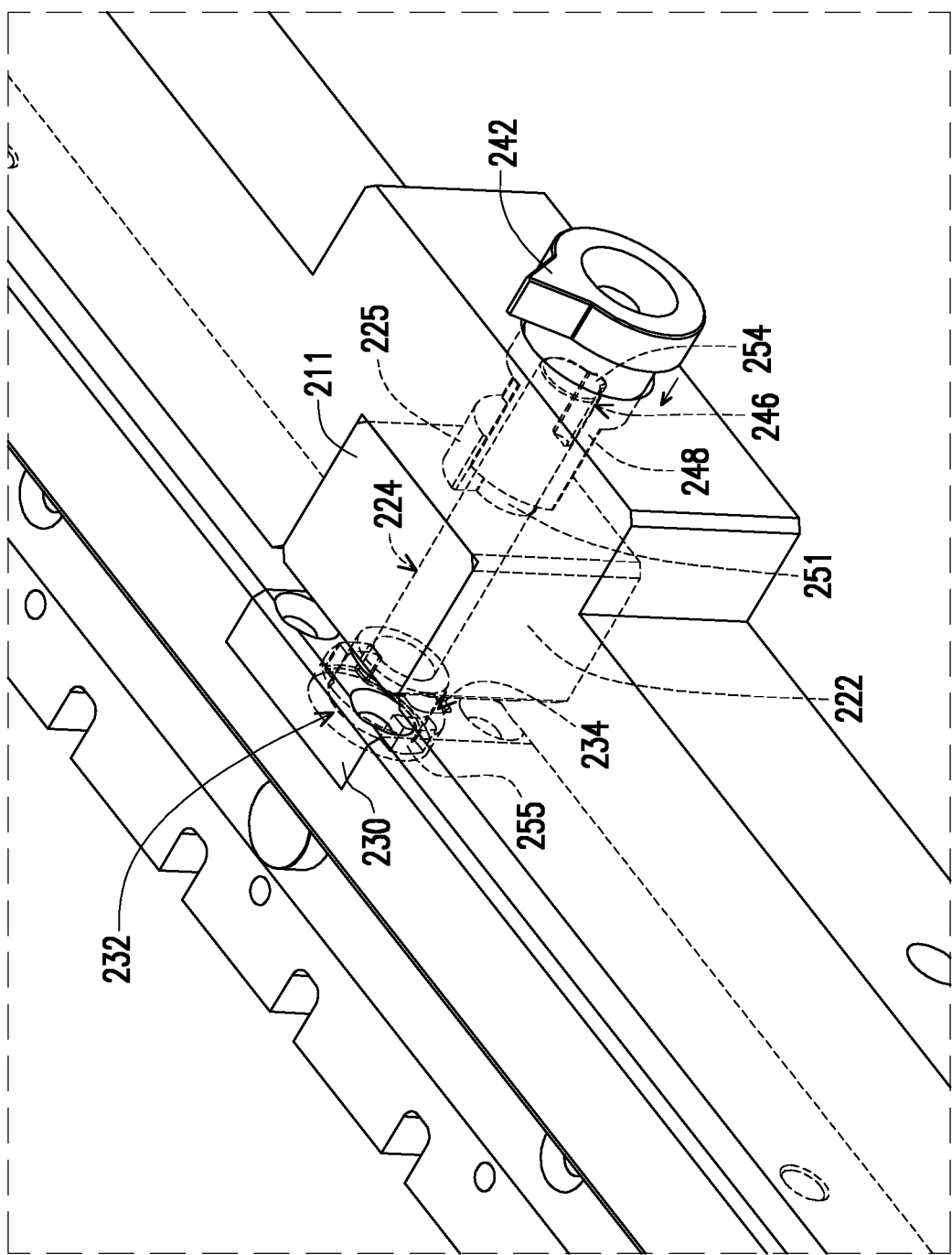

Referring to FIG. 10C, when the first rotating member 240 moves towards the surface 223 of the second main body 222, the second rotating member 250 is pushed by the first rotating member 240 such that the locking part 255 of the second rotating member 250 passes through the positioning hole 234 and enters to the inner space 232 of the second fixing member 230.

Figure 10D:
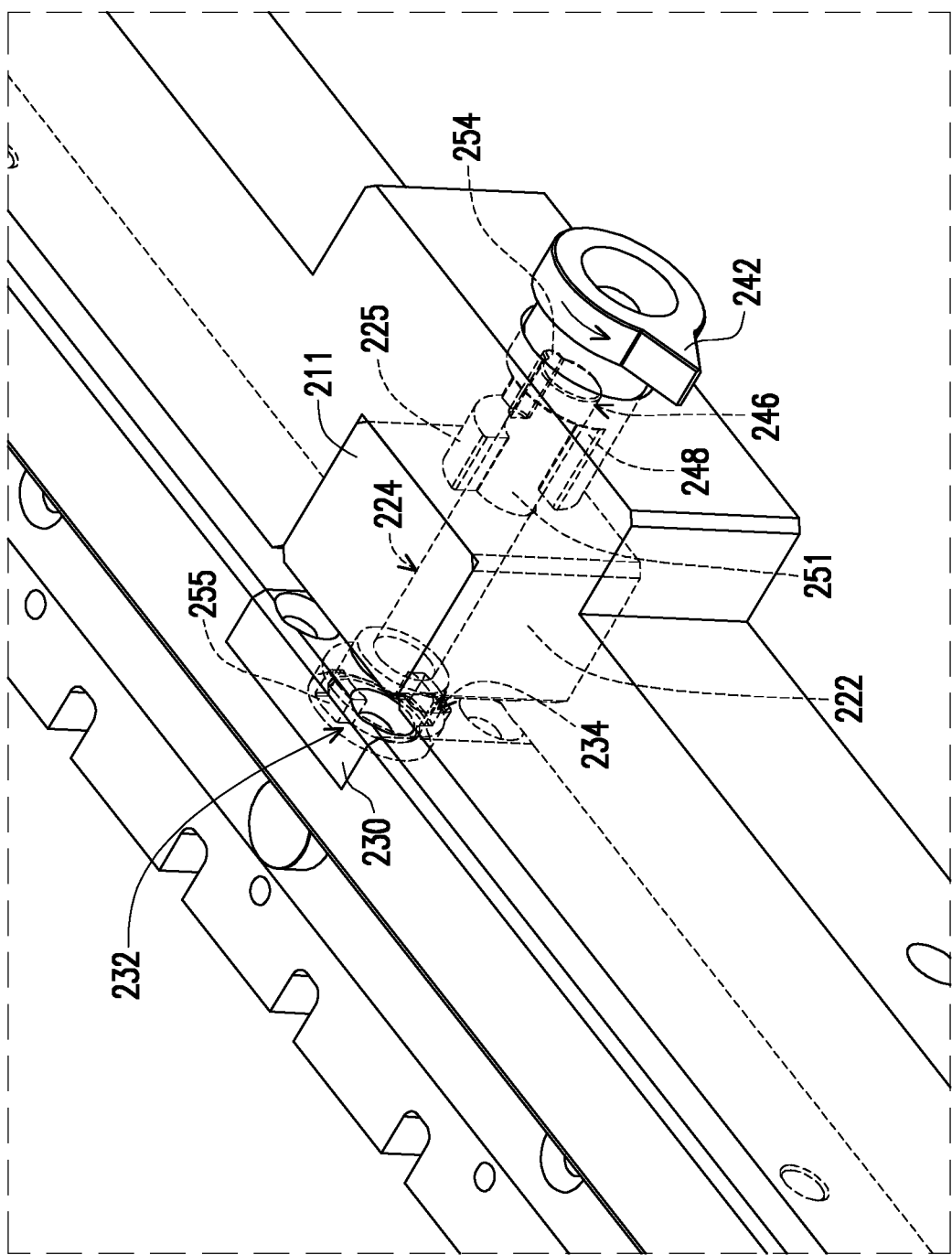

Referring to FIG. 10D, the locking part 255 of the second rotating member 250 is rotated to a position staggered with the positioning hole 234 by rotating the knob 242, such that the frame 138 is locked to the film separation module 140b. Therefore, the frame 138 can be detachably disposed at the film separation module 140b by the fixing module 220 quickly and easily.

In addition, as shown in FIG. 9C, the fixing module 220 further includes an elastic member 260 sleeved on the second main body 222 and disposed between the locking part 255 and the first main body 244. The elastic member 260 is used for restoring positions of the first rotating member 240 and the second rotating member 250 from FIG. 10C to FIG. 10B. Therefore, when the frame 138 is desired to be detached from the film separation module 140b, the user only needs to rotate the first rotating member 240 from the position in FIG. 10D to the position in FIG. 10C, the positions of the first rotating member 240 and the second rotating member 250 in FIG. 10C can be restored to the positions in FIG. 10B automatically, such that the frame 138 is unlocked from the film separation module 140b.

Figure 11:
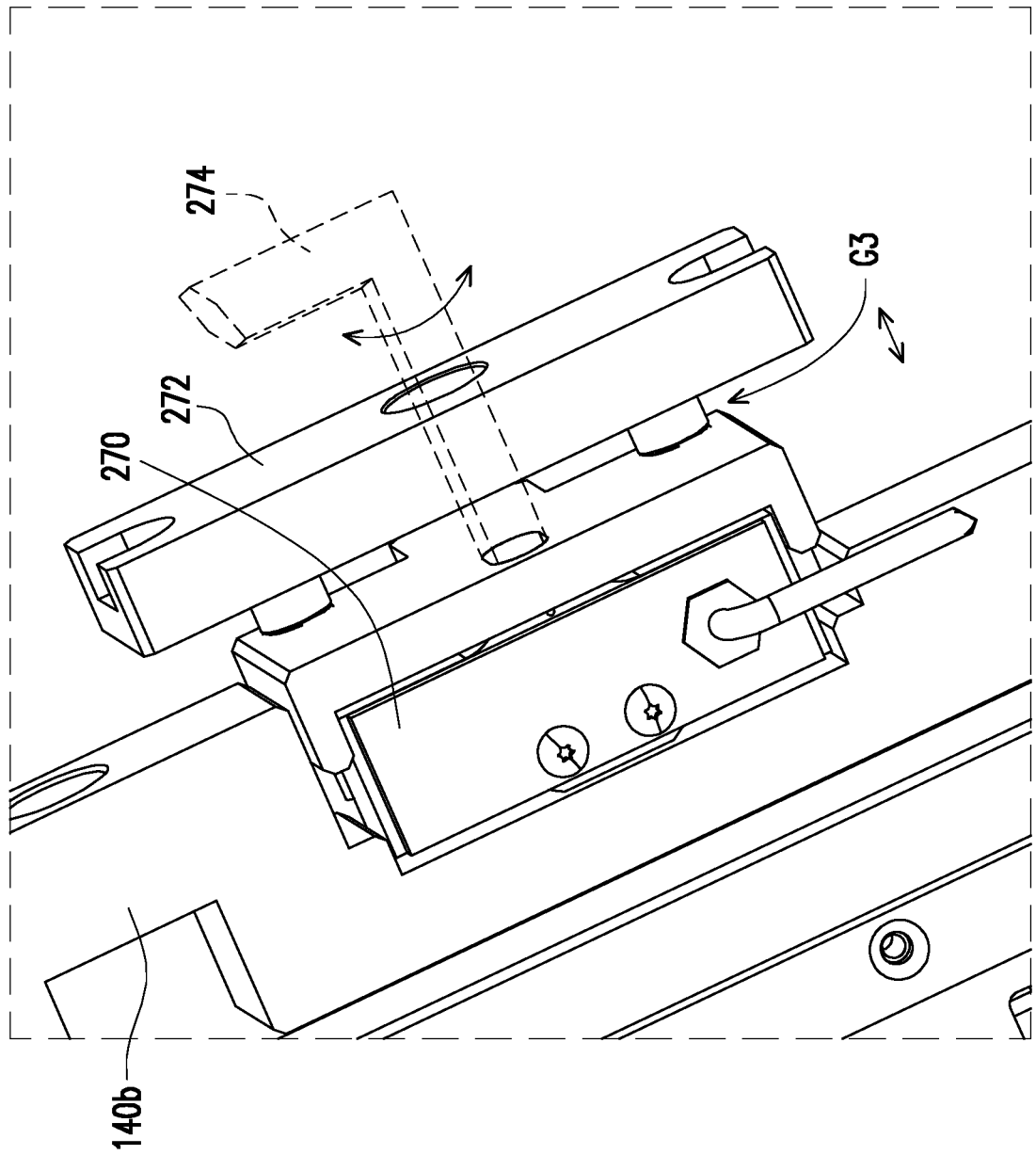
FIG. 11 is a partial enlarged view of an adjustable load cell of FIG. 9A.

FIG. 11 is a partial enlarged view of an adjustable load cell of FIG. 9A. Referring to FIGS. 9A and 11, in the embodiment, the imprinting apparatus 100b further includes adjustable load cells 270 disposed at a side of the transfer film 132. In the embodiment, the number of the adjustable load cells 270 is 2, but it is not limited thereto. The adjustable load cells 270 are used to detect the tension of the transfer film 132, and the values measured by the adjustable load cells 270 can be manually calibrated by using a tool, for example a hexagon wrench 274 (FIG. 11).

Specifically, a size of a gap G3 between the adjustable load cell 270 and a movable plate 272 can be adjusted by the hexagon wrench 274. Therefore, the values measured by the adjustable load cells 270 can be calibrated and become similar to each other. The overall tension of the transfer film 132 can be adjusted later to make the values measured by the adjustable load cells 270 more consistent.

In summary of the foregoing, in the imprinting apparatus of the disclosure, the lifting and pressing mechanism drives the imprinting roller to move along the normal direction of the imprinting platform and selectively pressurize the imprinting roller. When the imprinting roller is moved by the lifting and pressing mechanism to the first position, the lifting and pressing mechanism does not pressurize the imprinting roller, the imprinting roller contacts the transfer film located on the imprinting platform, and the transfer film is pressed by a weight of the imprinting roller. When the imprinting roller is moved by the lifting and pressing mechanism to the second position, the lifting and pressing mechanism pressurizes the imprinting roller, the imprinting roller contacts the transfer film, and the transfer film is pressed by a combination of the weight of the imprinting roller and a pressure of the lifting and pressing mechanism. Therefore, the imprinting roller of the imprinting apparatus can use more versatile and flexible pressure to imprint the transfer film and the imprinting platform through the lifting and pressing mechanism.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An imprinting apparatus, comprising:
    an imprinting platform;
    an imprinting roller disposed above the imprinting platform;
    a transfer module comprising a transfer film, wherein the transfer film is located between the imprinting roller and the imprinting platform;
    a lifting and pressing mechanism, linked with the imprinting roller, wherein the lifting and pressing mechanism drives the imprinting roller to move along a normal direction of the imprinting platform and selectively pressurizes the imprinting roller;
    a film separation module; and
    a fixing module, wherein the transfer module comprises a frame, the transfer film is disposed at the frame, the frame is detachably disposed at the film separation module by the fixing module,
    when the imprinting roller is moved by the lifting and pressing mechanism to a first position, the lifting and pressing mechanism does not pressurize the imprinting roller, the imprinting roller contacts the transfer film located on the imprinting platform, and the transfer film is pressed by a weight of the imprinting roller,
    when the imprinting roller is moved by the lifting and pressing mechanism to a second position, the lifting and pressing mechanism pressurizes the imprinting roller, the imprinting roller contacts the transfer film, and the transfer film is pressed by a combination of the weight of the imprinting roller and a pressure of the lifting and pressing mechanism,
    wherein the fixing module comprises a first fixing member fixed at the film separation module, a second fixing member fixed at the frame, a first rotating member passing through a first hole of the film separation module and located at a side of the first fixing member, and a second rotating member passing through the first fixing member and located between the first rotating member and the second fixing member.

2. The imprinting apparatus according to claim 1, wherein the lifting and pressing mechanism comprises a driving source, a base connected to the driving source, a holder disposed at an end of the imprinting roller and located in the base, the base comprises a lower part, an upper part and a guide post located between and connected to the lower part and the upper part, the guide post extends along the normal direction, the holder is slidably disposed at the guide post.

3. The imprinting apparatus according to claim 2, wherein the lifting and pressing mechanism further comprises a pressure sensor fixed to the upper part of the base and located between the upper part of the base and the holder, when the imprinting roller is at the first position, the holder contacts the lower part of the base, and a gap is formed between the holder and the pressure sensor, when the imprinting roller is at the second position, the holder contacts and presses the pressure sensor.

4. The imprinting apparatus according to claim 1, wherein the lifting and pressing mechanism comprises two levelness detectors located at two ends of the imprinting roller.

5. The imprinting apparatus according to claim 1, wherein the first rotating member comprises a knob exposed from the film separation module, a first main body having a slot, and a first blocking member extending from the first main body to a direction away from the knob, the first main body passes through the first hole of the film separation module.

6. The imprinting apparatus according to claim 5, wherein the first fixing member comprises a second main body, a second hole formed on the second main body and corresponding to the first hole and a second blocking member protruding from a surface of the second main body towards the first rotating member,
    when the first rotating member is located at an original position, the first blocking member of the first rotating member is aligned with the second blocking member of the first fixing member, such that a movement of the first rotating member towards the first fixing member is limited by the second blocking member, when the first rotating member is rotated to a position that the first blocking member is staggered with the second blocking member, the first rotating member is adapted to move towards the surface of the second main body.

7. The imprinting apparatus according to claim 6, wherein the second rotating member comprises a third main body passing through the second hole of the first blocking member and having a first side close to the first rotating member and a second side close to the second fixing member, a protrusion located on an outer surface of the third main body, near the first side and inserted into the slot of the first rotating member, and a locking part located at the second side.

8. The imprinting apparatus according to claim 7, wherein the second fixing member comprises an inner space and a positioning hole communicated with the inner space,
    wherein when the first rotating member moves towards the surface of the second main body, the second rotating member is pushed by the first rotating member such that the locking part of the second rotating member passes through the positioning hole and enters to the inner space of the second fixing member, and then the locking part of the second rotating member is rotated to a position staggered with the positioning hole by rotating the knob such that the frame is locked to film separation module.

9. The imprinting apparatus according to claim 8, wherein the fixing module further comprises an elastic member sleeved on the second main body and disposed between the locking part and the first main body.

10. The imprinting apparatus according to claim 8, further comprising adjustable load cells disposed at a side of the transfer film.

11. The imprinting apparatus according to claim 1, further comprising
    a tensile force adjustment mechanism, comprising two rods and two lifting machines, wherein an extension direction of the two rods is parallel to an extension direction of the imprinting roller, the two rods are in contact against the transfer film and are respectively located between the fixed frame of the transfer module and the imprinting platform and between the movable frame of the transfer module and the imprinting platform, the two lifting machines respectively adjust lifted heights of the two rods, and the transfer film is pulled open through lifting by the two rods to generate a tensile force.

12. The imprinting apparatus according to claim 11, wherein a length of each of the rods is greater than a width of the transfer film.

13. The imprinting apparatus according to claim 11, wherein the tensile force adjustment mechanism further comprises two tensile force sensors respectively disposed between the two rods and the two lifting machines to detect a real-time tensile force of the transfer film.

* * * * *